United States Patent
Bengel

[11] Patent Number: 5,180,932
[45] Date of Patent: Jan. 19, 1993

[54] CURRENT MODE MULTIPLEXED SAMPLE AND HOLD CIRCUIT

[76] Inventor: David W. Bengel, 5939 Amapola Dr., San Jose, Calif. 95129

[21] Appl. No.: 668,379

[22] Filed: Mar. 11, 1991

Related U.S. Application Data

[63] Continuation-in-part of Ser. No. 494,197, Mar. 15, 1990, abandoned.

[51] Int. Cl.[5] .................... H03K 17/16; G11C 27/02
[52] U.S. Cl. .................................. 307/353; 307/491; 307/494
[58] Field of Search ............ 307/352, 353, 491, 494; 328/151

[56] References Cited

U.S. PATENT DOCUMENTS

| | | | |
|---|---|---|---|
| 3,516,002 | 6/1970 | Hillis | 307/353 |
| 3,643,110 | 2/1972 | Thompson | 307/353 |
| 3,838,346 | 9/1974 | Cox | 307/353 |
| 3,988,689 | 10/1976 | Ochi et al. | 307/353 |

Primary Examiner—John Zazworsky
Attorney, Agent, or Firm—Gail W. Woodward; Irving S. Rappaport; James W. Rose

[57] ABSTRACT

A sample and hold circuit is disclosed in which differentially coupled input stages are multiplexed to drive a common output stage. In this way, a plurality of input stages can be employed wherein the transition between sample and hold modes produces greatly reduced switching transients. The circuit has very high overall gain so that sampling accuracy is improved and a very low current input stage configuration permits the use of small hold capacitors without introducing excessive droop in the hold mode. The differential balance is completed by a dummy hold capacitor which is switched along with the hold capacitor. Both of these capacitors are switched in a virtual ground configuration. Also, disclosed are means for producing an auto zero input condition, means for adding a correlation feature for improved digital performance and means for injecting controlled offset potentials so that the sample and hold means can be employed as either a DA converter or an AD converter in either a pipelined or recirculating converter state.

22 Claims, 13 Drawing Sheets

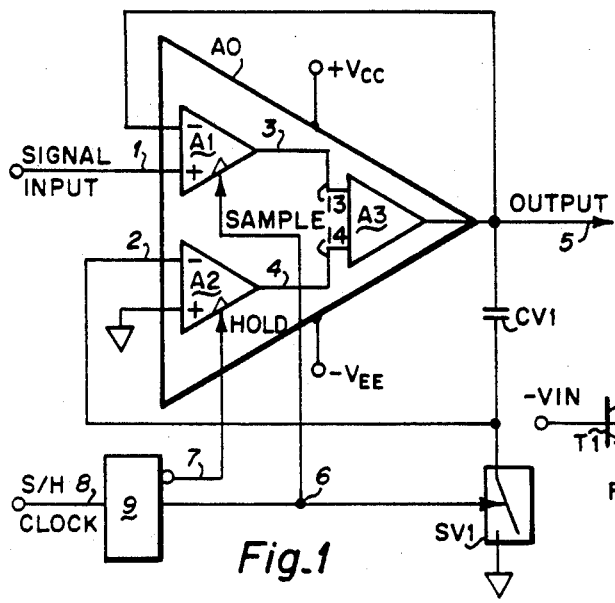
Fig._1
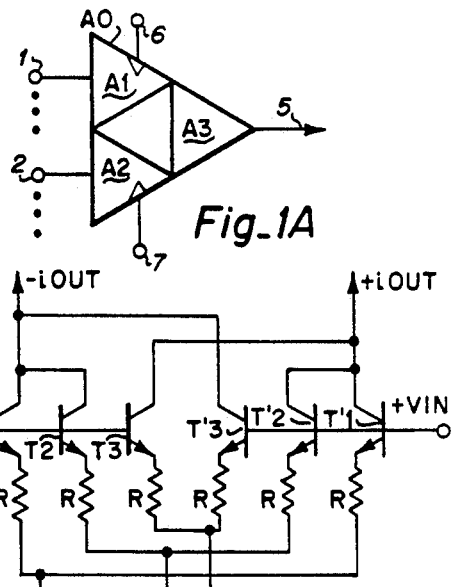
Fig._1A
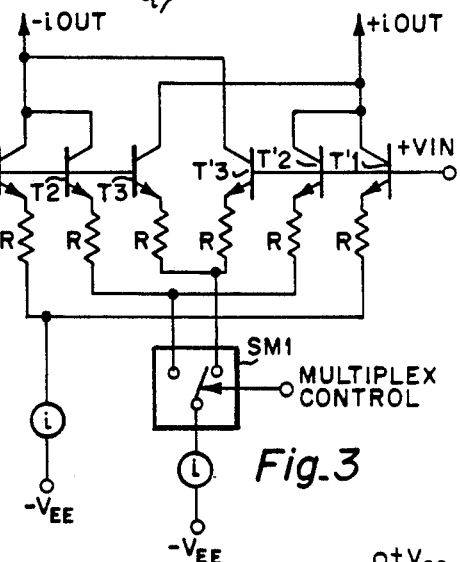
Fig._3
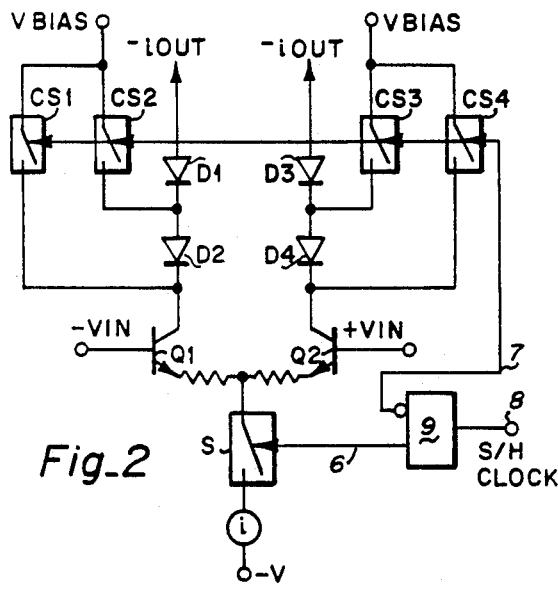
Fig._2
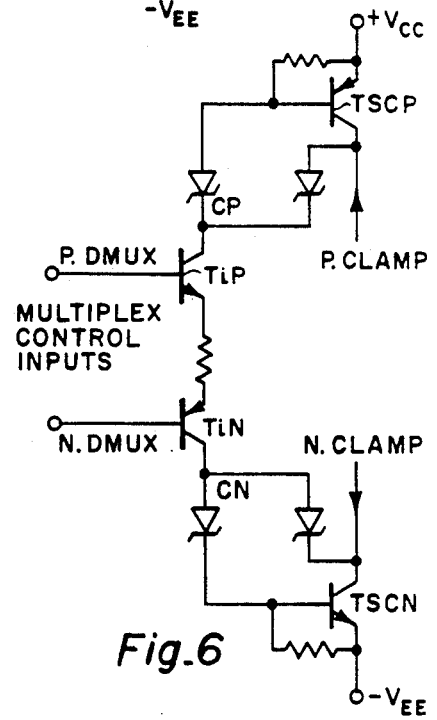
Fig._6
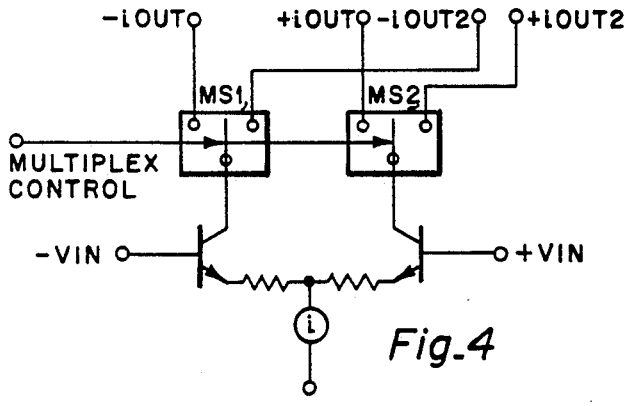
Fig._4

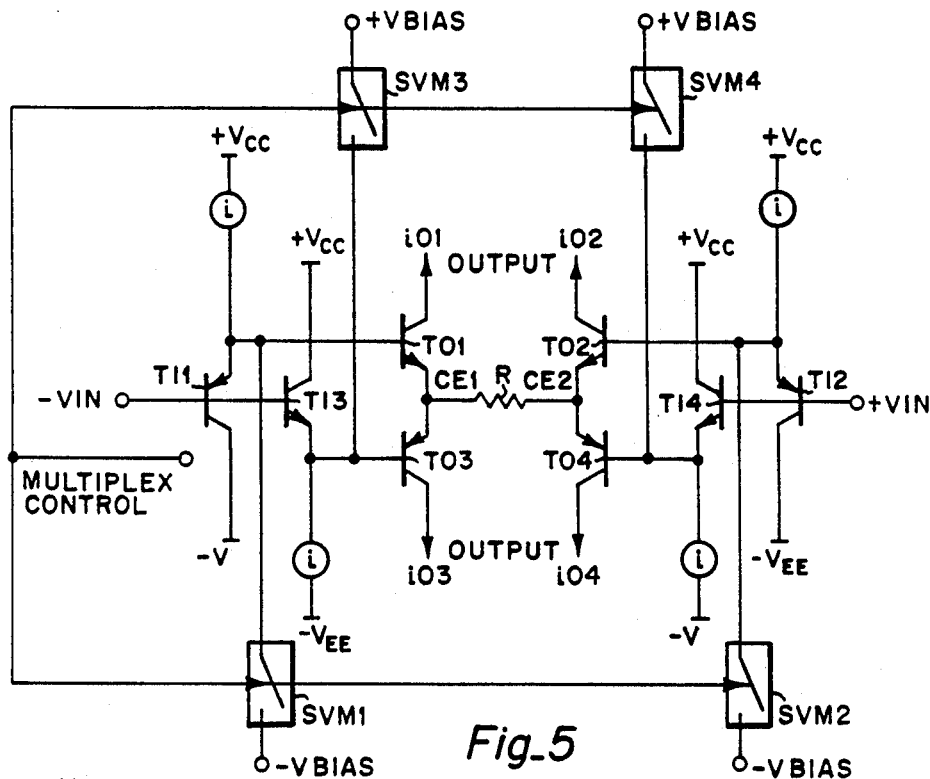
Fig_5
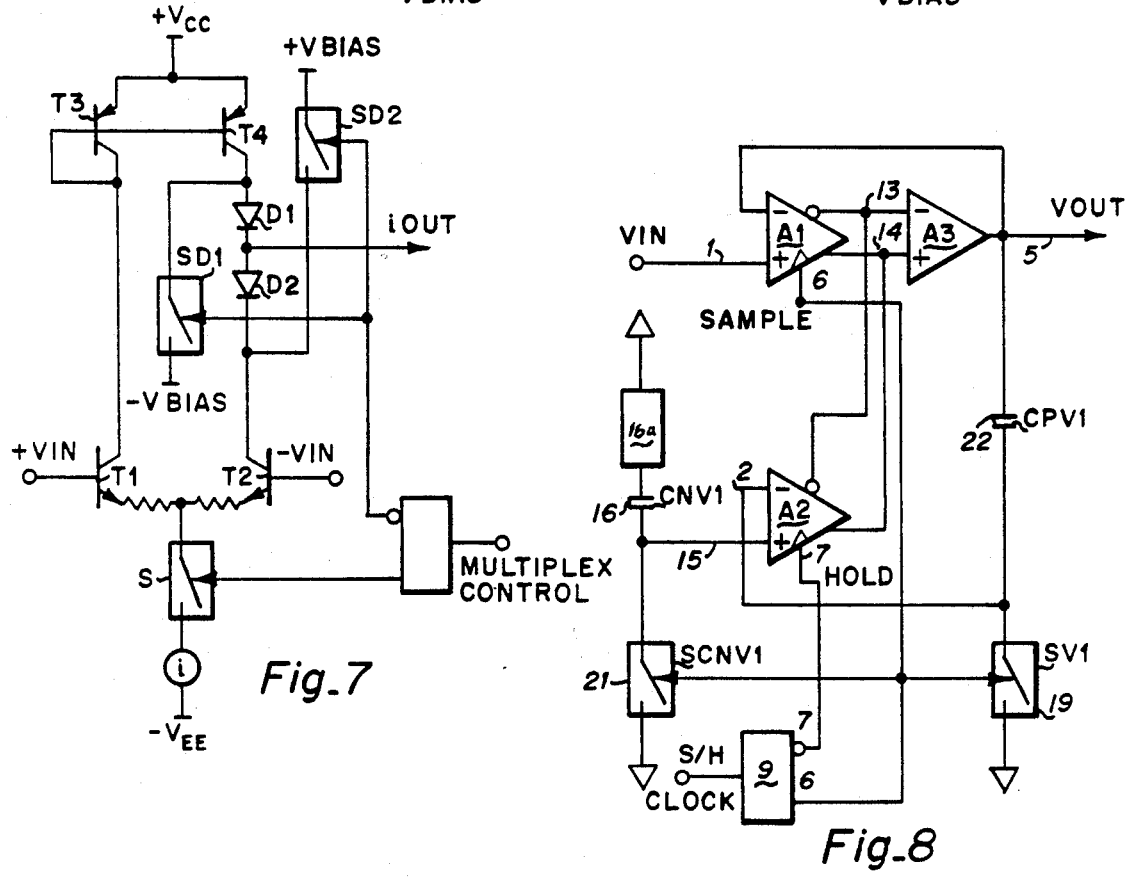
Fig_7
Fig_8

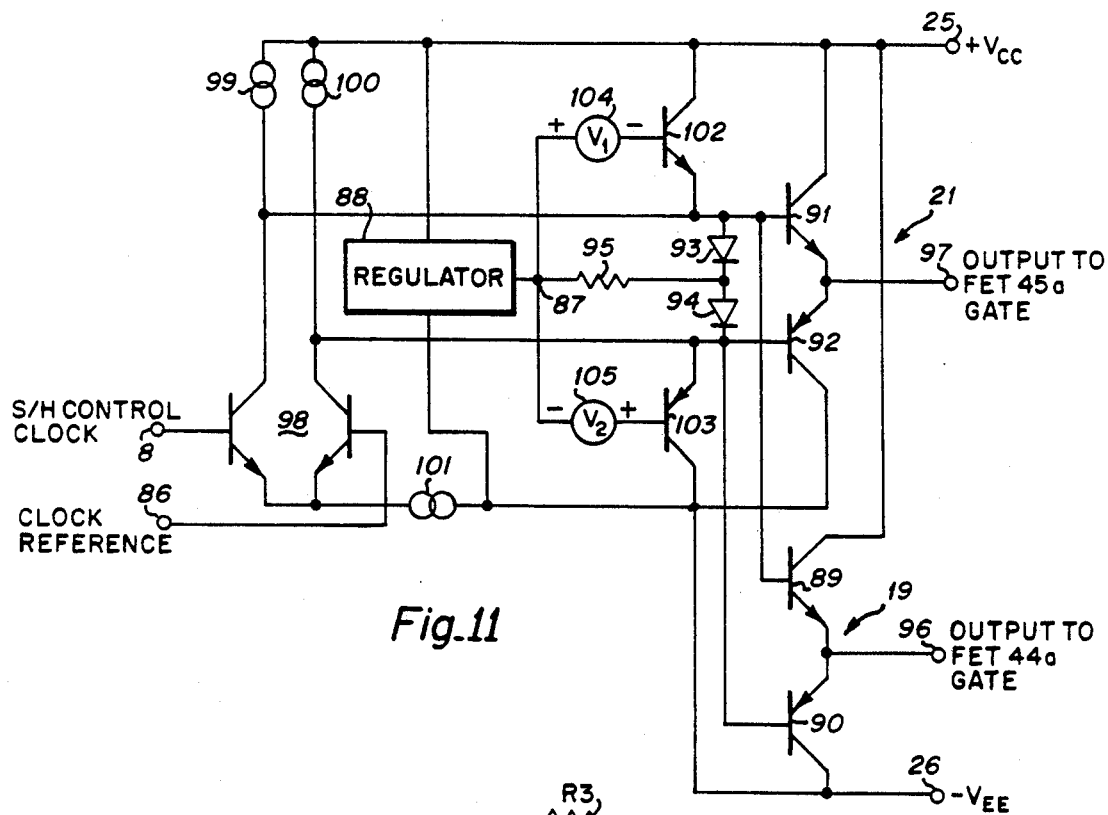
Fig._11
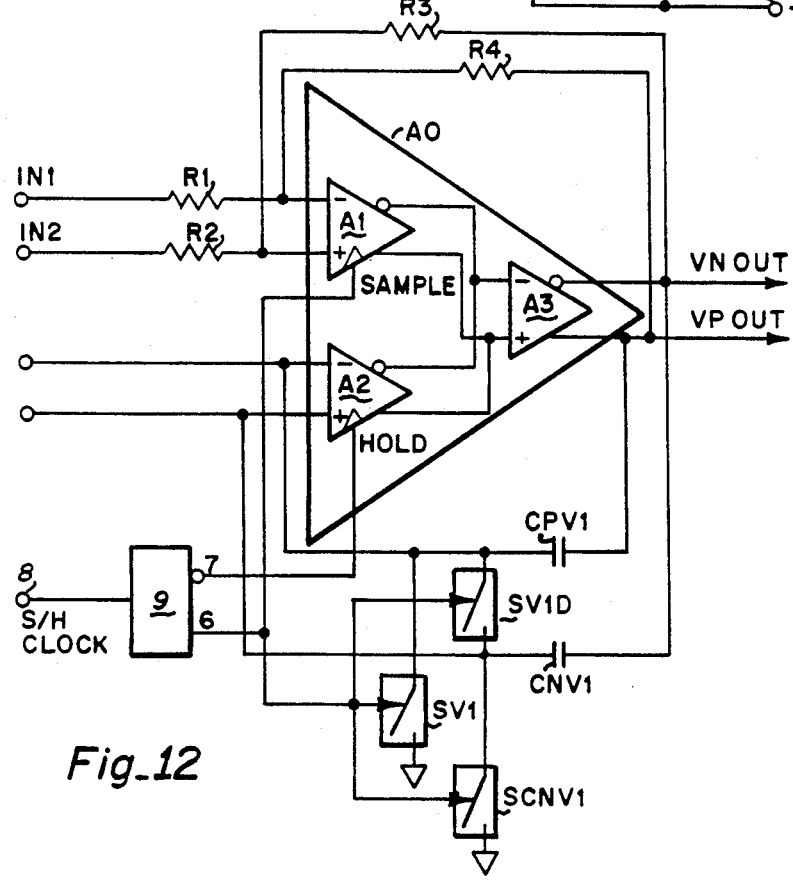
Fig._12

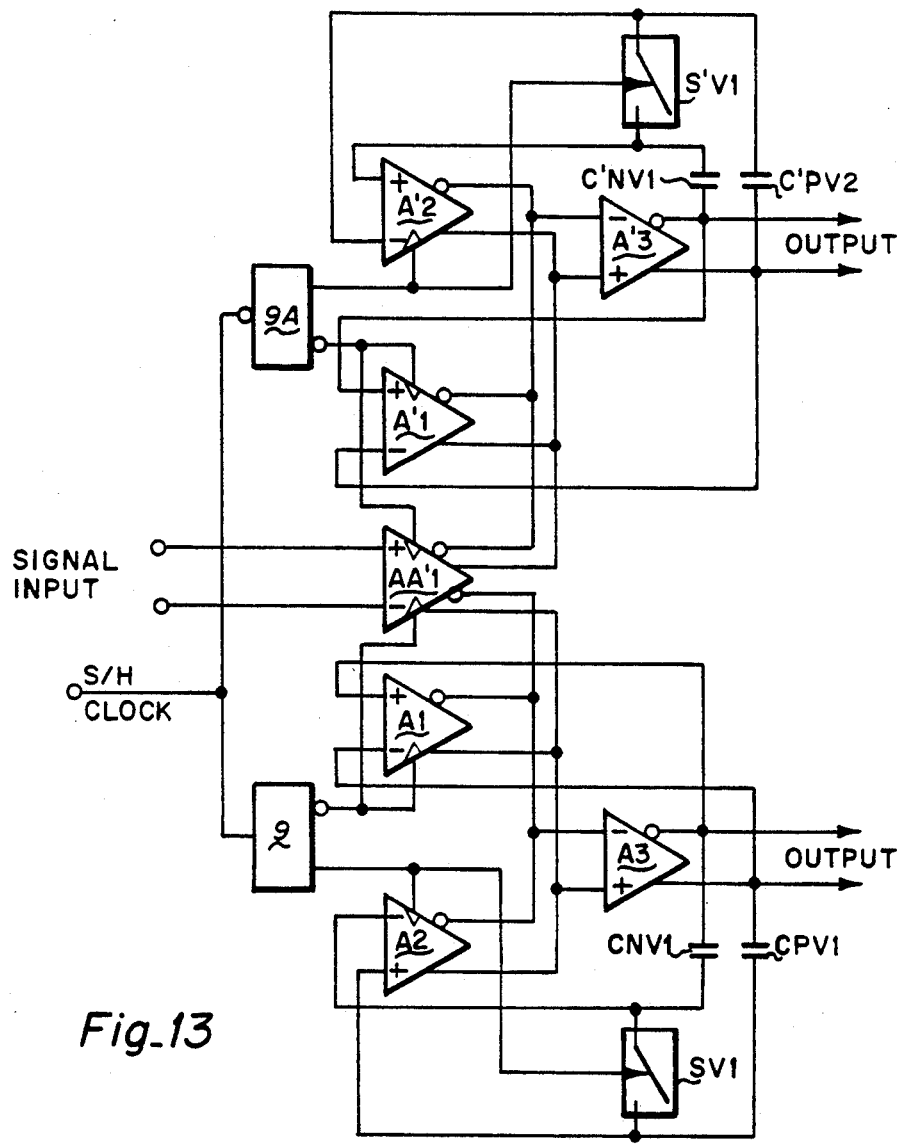
Fig_13
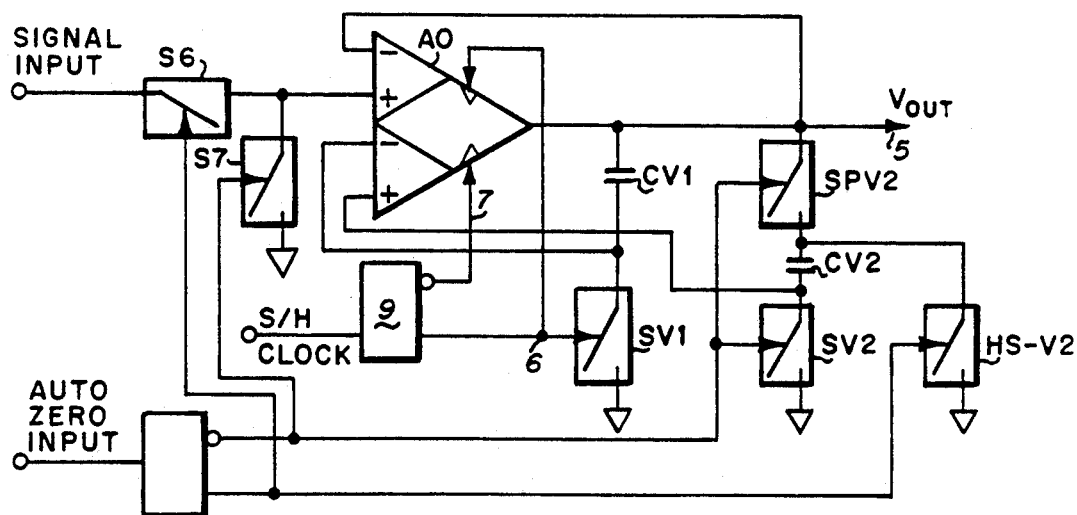
Fig_14

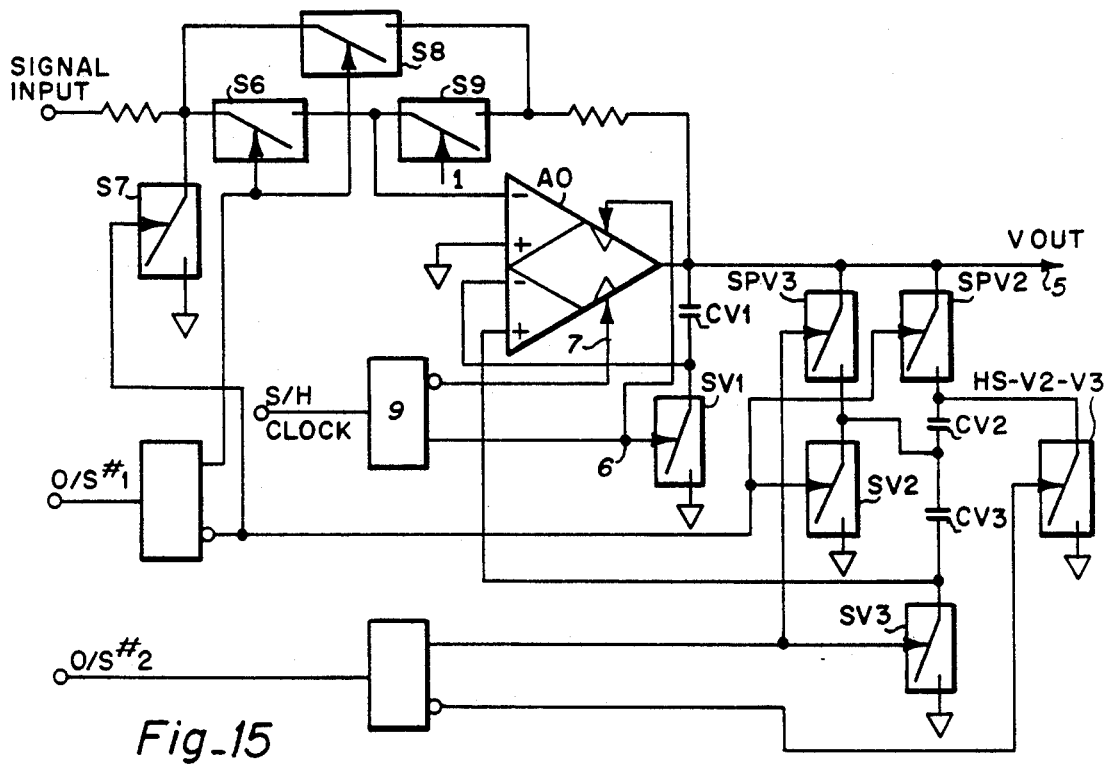
Fig_15
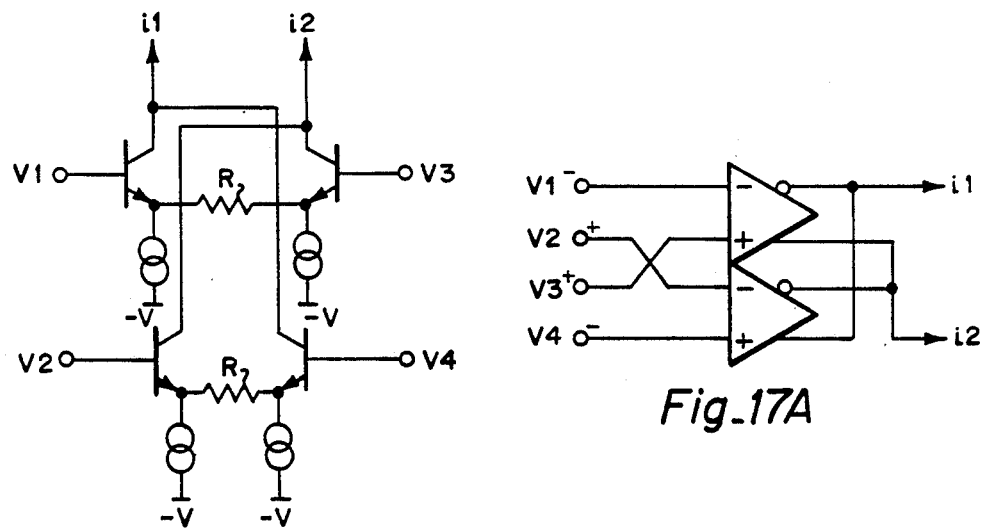
Fig_17
Fig_17A

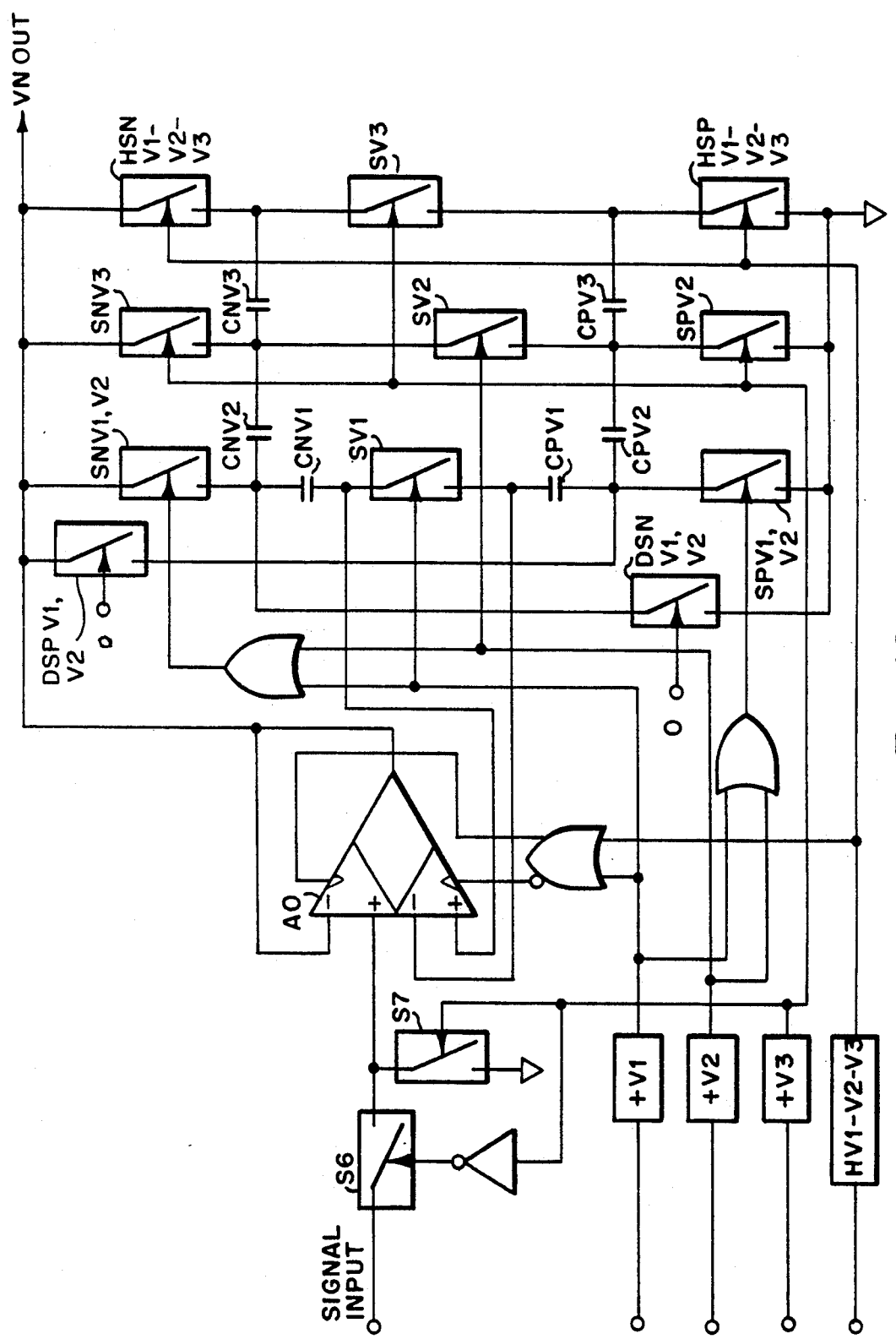
Fig_16

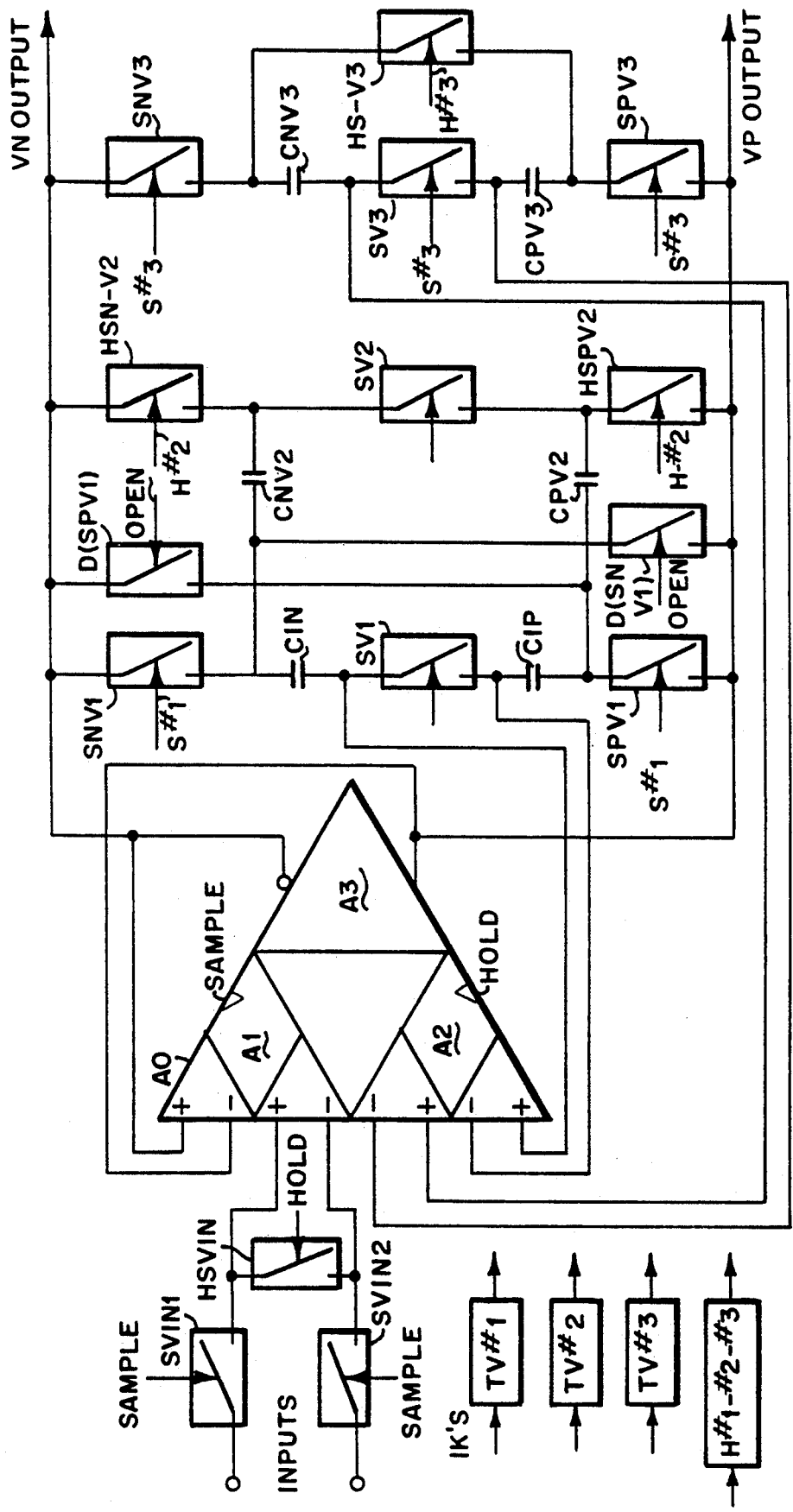
Fig_18

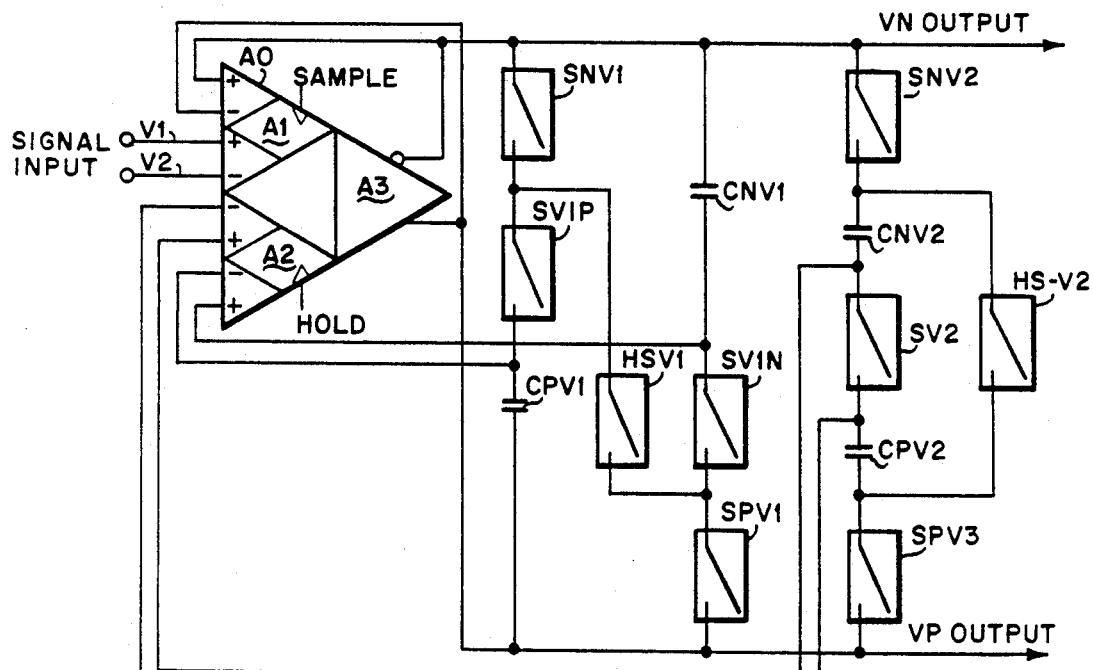
Fig_19
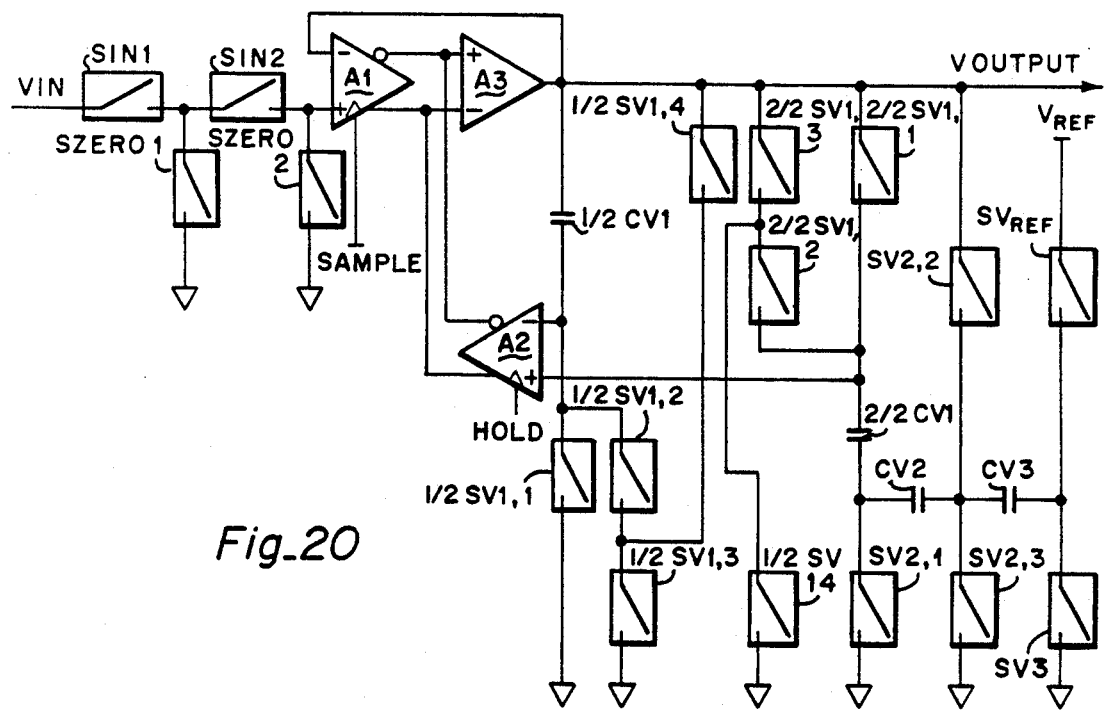
Fig_20

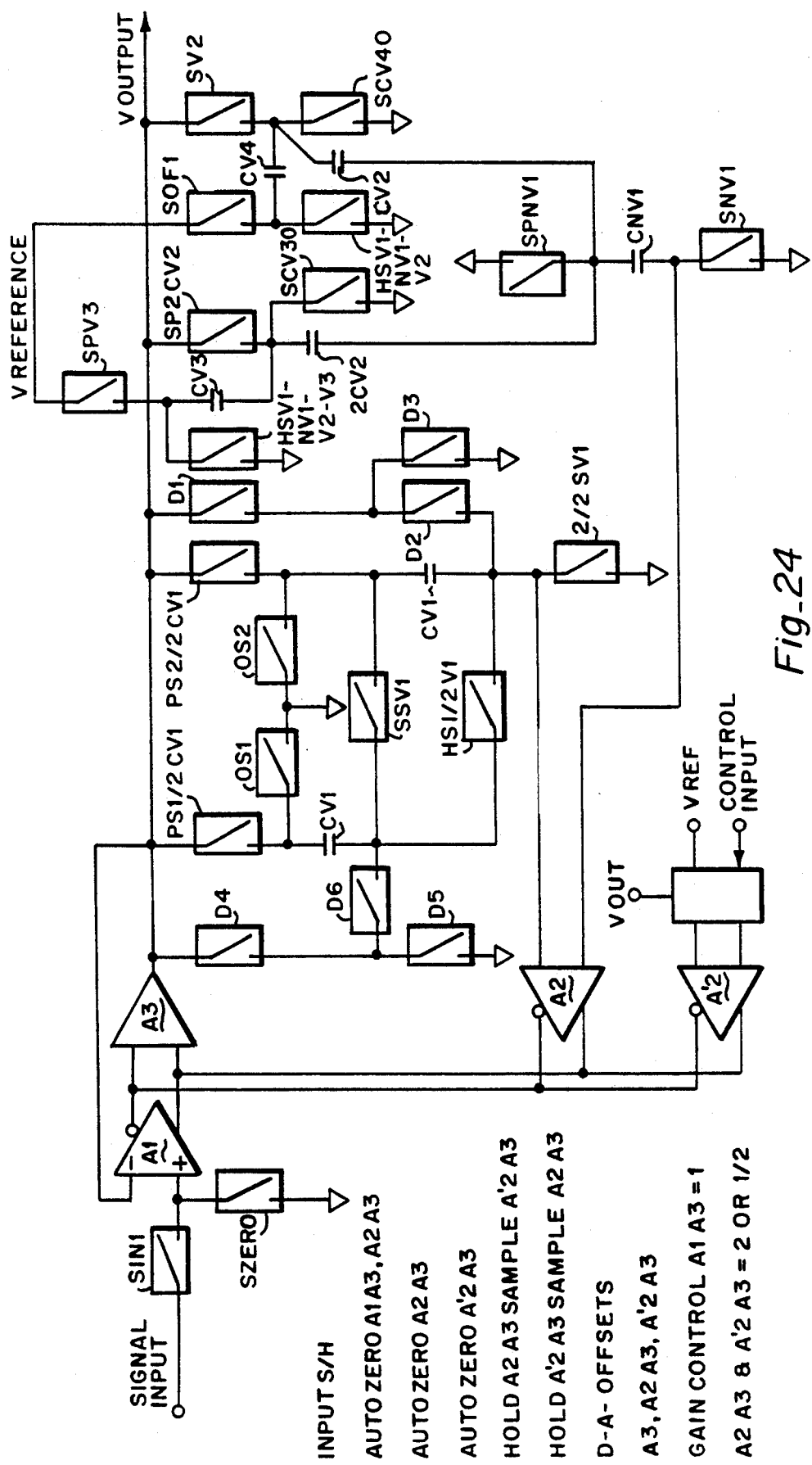
Fig_24

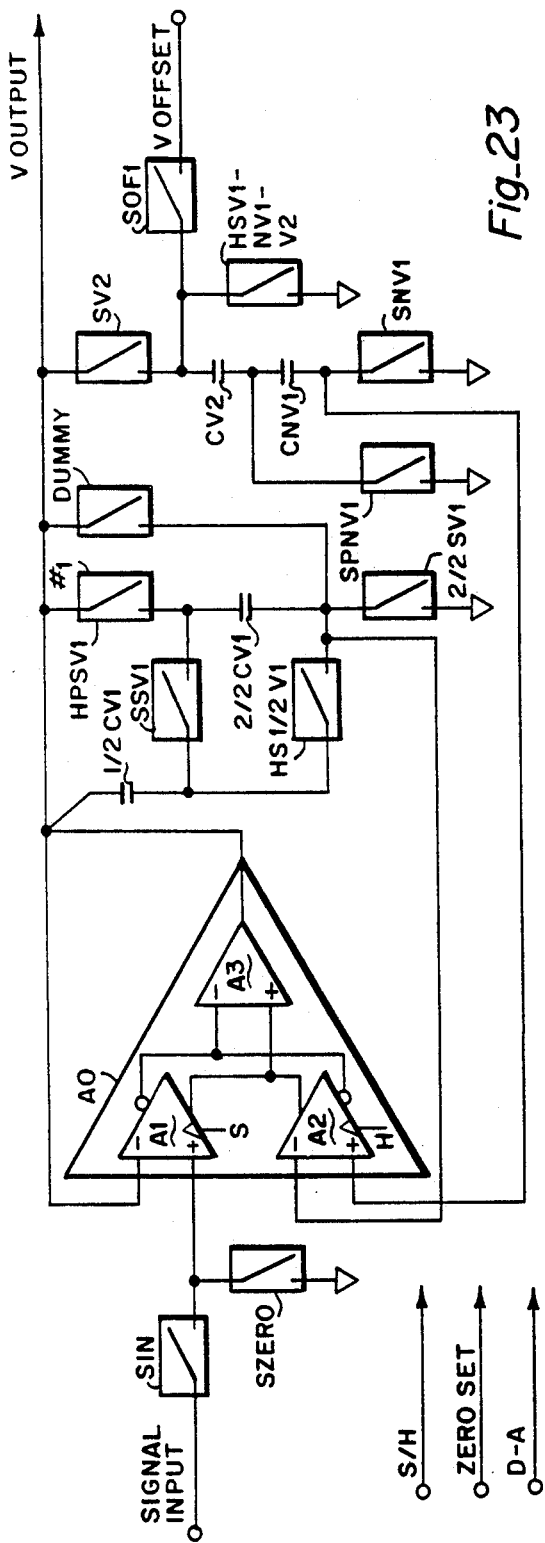
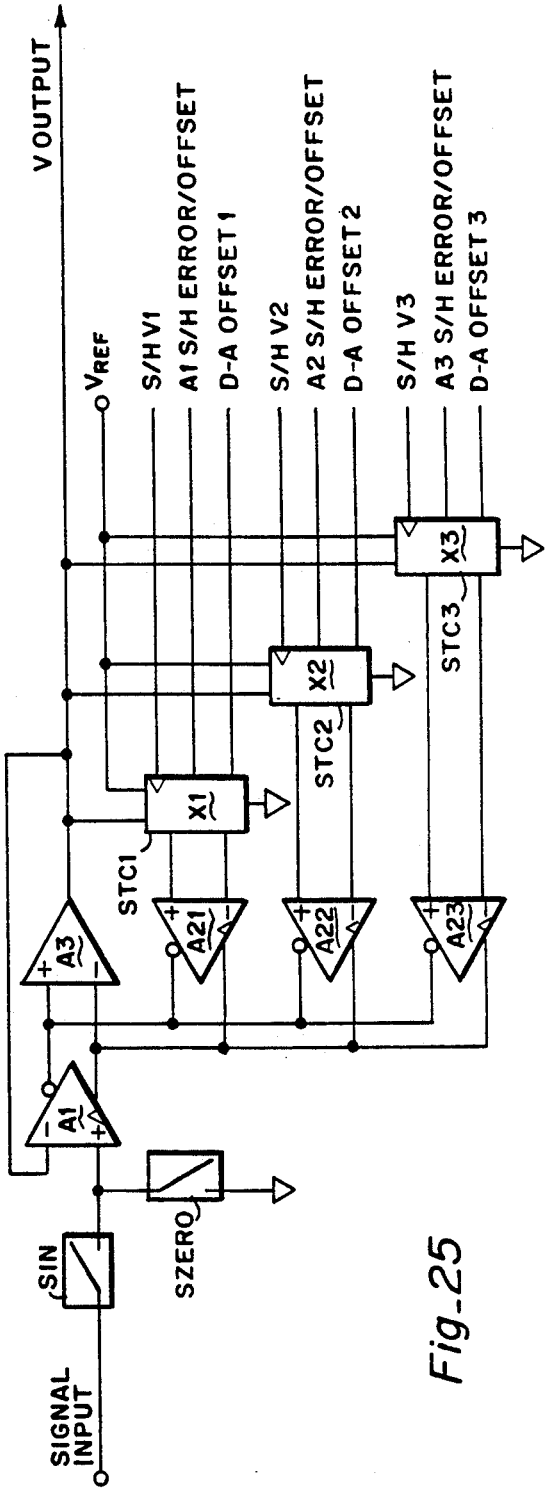
Fig. 23
Fig. 25

CURRENT MODE MULTIPLEXED SAMPLE AND HOLD CIRCUIT

Pursuant to 35 U.S.C. 120, this is continuation-in-part of application Ser. No. 494,197, filed Mar. 15, 1990 now abandoned.

BACKGROUND OF THE INVENTION

1. Field of Invention

The field of this invention is related to track-and-hold or sample-and-hold (S&H) circuits. The two terms are normally used interchangably with the slight distinction that there are indeed some sample-and-hold designs that are not capable of tracking a voltage over a period of time, but only of sampling the voltage at a given time and then holding the voltage. For instance, most sampling oscilloscopes use a diode bridge sampler, which because of design constraints needed to obtain high input bandwidth with minimum power, is only capable of sampling and holding as opposed to tracking, sampling and holding. This nomenclature S&H, will be used throughout this patent specification.

The two most important specifications for a high performance S&H are resolution and bandwidth. Since as much as 90% of the commercial applications for S&H are for A-D converters the most relevant way to specify S&H's is in relation to their suitability for a given A-D converter specification. Thus, the resolution is usually specified in number of bits and the maximum sample frequency at which that bit-wise resolution can be guaranteed.

It is generally recognized that for resolutions above 10 or 11 bits, which correspond to a fractional resolution of 1 part in 1024 to 1 part in 2048, it becomes necessary to employ a high accuracy feedback amplifier. Simpler configurations that rely on only switches, capacitors and open loop amplifiers are generally not qualified for 12 bit or higher accuracy requirements because 1 part in 4096 linearity cannot be sustained without feedback. This invention is specifically concerned with configurations that employ feedback in both the tracking/sampling mode as well as in the hold mode.

Specifically, S&H configurations will be described that employ multiplexed feedback amplifier configurations with at least two sets of potentially active differential, dual differential or single-ended inputs and one or more sets of differential or single-ended outputs. Sarkissian 1972 U.S. Pat. No. 3,638,131, teaches how to use series diodes to isolate current mode multiplexed differential amplifiers, Series switches on the inputs is another well-known method of multiplexing. Figures of merit for multiplexed feedback amplifiers include cross-talk or input to output isolation, gain error, offset, etc. As will become clear, all these characteristics of a multiplexed feedback amplifier will determine the corresponding specifications for the S&H that incorporates the multiplexed amplifier.

2. Background of the Invention

Since S&H's are mainly included in a given A-D converter design, due to accurate requirements, it is useful to consider broad groupings of S&H methods based on accuracy. The simplest S&H is simply a series switch charging a single capacitor. The primary disadvantage is lack of isolation in the hold mode. Such first order designs require large hold capacitors for accuracy which reduces the bandwidth of the switch series resistance charging such a large capacitor. Also, the switch usually feeds through some charge in the transition from on to off (i.e., tracking to holding) and the switching charge feedthrough as well as the time at which the sampling occurs are generally not constant with input signal level. These variable effects introduce systematic harmonic distortion that is signal level dependent. Also, slew rate dependent variations of the effective sample time can occur depending on the method of actuating the on to off transition of the series switch.

It is an object of the present invention to reduce these sources of systematic harmonic distortion by providing configurations that employ a ground referenced series switching configuration. In this way, input signal level variations are never experienced by the switch, only slew dependent dynamic current loading is experienced, which is minimized if the switch transistors are properly sized in relation to the dynamic current variation to maintain a high effective $F_T$. It is a further object of this invention to provide differential cancellation of the switching transition charge feedthrough. This allows for the use of a larger switch/capacitor ratio which increases available bandwidth and/or reduces IC die size and power.

DC offset errors are also very important for A-D converter applications and multiplexed amplifiers have more sources of errors than do ordinary op-amps. It is a further object of this invention to provide S&H configurations that can effectively reduce the DC errors by employing an auto-zero capability. If the auto-zero cycle capability is invoked during each sample/hold cycle then an added advantage is that low frequency noise (1/f), up to about $\frac{1}{3}$ of the sampling frequency, can be effectively eliminated.

It is generally recognized that differential signal coupling is advantageous for integrated circuit A-D converter applications. Ground and power supply noise are transformed into common mode noise sources that leave the differential signals unperturbed. However, most signal sources of interest are usually supplied in single-ended form. Transformer coupling is not preferred because of expense and lack of D-C coupling. There are indeed feedback amplifier configurations that can accomplish a single-ended to diferential translation and it is a further object of this invention to provide complete S&H functions that provide a single-ended input signal capability with a differential output signal capability.

Charge-coupled devices (CCD's) have unique signal handling capabilities that require more complex S&H configurations. Specifically, CCD's have a multi-phase clock whereby there is a reference signal output phase and signal output phase. The real signal that is desired for the highest SNR performance is the difference between the reference and signal. The signal that represents this difference is called a double correlated sample and such systems of sampling are generically referred to as double correlated sampling. The ability to output such a signal is not intrinsic to CCD's themselves, but must be added with appropriate S&H functions. Usually, two separate S&H's are required as well as a method of subtracting the two values. It is a further object of the present invention to provide S&H means that directly provide double correlated sampling capability using only one multiplexed amplifier and that, further, this be made possible with zero offset correction capability.

The general field of A-D converter designs that can usefully employ an S&H include successive approximation, pipelined successive approximation and recirculating. The minimum complexity recirculating A-D converter requires several S&H functions, a gain of two amplifier capability, a 1 bit D-A offsetting capability and a 1 bit flash A-D, as well as the necessary control signals and digital logic. Recirculating A-D converters are very hard to manufacture because of the difficulty in maintaining an exact gain of two amplifier with zero offset as well as of supplying the D-A offsetting function with absolute 16 bit linearity. It is a further object of the present invention to provide an S&H function that has two distinct signal input capabilities, each of which can be selectively held on the output, that has a high accuracy gain of two transfer function, that uses double correlated sampling type capabilities to selectively actuate a 1 bit D-A offsetting capability and that is also capable of zero offset correction for each of the input signal capablties, all to a high accuracy capable of supporting 16 bit recirculating A-D converter configurations.

SUMMARY OF THE INVENTION

It is an object of the present invention to provide an S&H function suitable for integrated circuit (IC) implementation including IC A-D converter and double correlated sampling applications that have a reduced power dissipation by virtue of employing only one active amplifier for each signal output capability, that has reduced input offset error due to differential cancellation of charge and auto zero capability which is basically a double correlated sampling capability, that has reduced systematic harmonic distortion due to using ground referenced switches and that is flexible enough to allow for multiple arbitrary transfer functions between input(s) and output(s) based on arbitrary linear or non-linear feedback networks and/or offsetting inputs active in the hold mode.

These and other objects are obtained by employing multiplexed amplifier systems for selective signal coupling and hold capacitors and switches external to the multiplexed amplifier for tracking signal acquisition and hold mode registration of sampled voltage, whereby one terminal of the capacitor(s) are driven by the amplifier(s) output(s) while the second terminal of the capacitor(s) is clamped to a D-C reference potential in the tracking mode (or possibly the switch clamps two capacitors together which are being differentially driven or even driven single-ended) and in the hold mode the clamp action is released and the capacitor is employed in a virtual ground configuration around a high gain amplifier due to selectively enabling the multiplexed amplifier system to output the voltage on the capacitor(s) rather than the input signal coupling(s). Standard differential input high gain amplifiers can be employed as well as the more exotic locally constrained feedback configurations including current mode feedback and dual counterbalanced differential pairs for differential input and differential feedback and that afford high input to output isolation when de-multiplexed and that allow for single-ended to differential conversion as well as separate D-C offsetting inputs while the hold capacitors are active in the virtual ground configuration in the hold mode.

It is a still further object of the invention to switch input stages in a differential amplifier configured to have high gain and low offset and wherein the amplifier has very low leakage inputs to minimize droop rate and employs differential coupling to further reduce droop rate since the common mode droop rate does not affect the output signal voltage until the differential amplifier experiencing the common mode droop enters a region of high non-linearity.

These and other objects are usually most expeditiously achieved, depending on the performance requirements and process capabilities, in the following manner. A two stage op-amp configuration is usually employed because of the need for high gain to achieve high resolution; however, single stage feedback amplifier configurations, such as folded cascode, can also be employed. In the case of folded cascode, the low gain emitter follower output could be considered to be the second stage. In all such cases, there are either single-ended or differetial current mode outputs available that indeed make possible the high gain amplifier. It will almost always be advantageous to utilize selective enabling and disabling of the current mode outputs of a transconductance stage and/or using current steering to connect a given input stage to several outputs, as a basic device for multiplexing control of an active feedback system output between different inputs. It is advantageous to employ diodes in series with such current mode outputs in order to achieve higher isolation when the transconductance modulation is disabled. It should also be noted that when deselected, the diodes should be clamped with as low a resistance as practical to a low impedence voltage bias that effectively reverse biases them so that feedthrough from the deselected transconductance stage will be shunted to the clamp voltage which will be isolated from the active signal path by the reverse-biased diode. This is not to say that such multiplexing of active signal paths should only be accomplished with current mode multiplexing. Series switching of the input voltage sources controllng a differential pair, especially when CMOS switches are available, increases isolation and provides the increased flexibility needed to inject known input voltages to control the amplifier output so that zero offset correction can be implemented. However, it is not generally preferred to use series switches directly connected to the virtual ground node(s) in the hold mode. Anything extra attached to the sensitive control inputs, which only have small capacitors operating in the hold mode due to the need to reduce power dissipation and die area, is likely to inject a spurious charge in the process of it's operation and corrupt the accuracy of the overall system. Unless a given switch can be very well matched and compensated it is not tolerable to consider it's use in a high accuracy S&H system. All critical switches must be individually and/or differentially compensated for charge feedthrough. This brings up another critical point of design, namely, that the ground referenced switch in series with the hold capacitor must be turned from a low resistance state to a high resistance state before the multiplexed amplifier system is selected for the hold mode. This is because any spurious signal that occurs on the output when the input to output signal path is deselected will be impressed on the hold capacitor if its ground referenced series switch is still in a low resistance state If the switch is already open, when the multiplexed amplifier makes its transition, only capacitive charge is divided between the hold capacitor proper and the series switches parasitic off capacitance. Since the feedback action of placing the hold capacitor in the virtual ground configuration brings the connection common to the switch and the hold capacitor back to the virtual ground potential, regardless of switching glitches after the series ground referenced clamping switch opens, it follows that the divider action of the switch parasitic capacitance and the hold capacitance will establish an accurate out voltage once the dynamic disturbance in switching from the feedback mode of tracking to the feedback mode of holding settles out. The two phases of signal acquisition followed by the transition to hold mode output signal registration require that each of the two feedback paths alternately enabled settle to the required accuracy. Thus, the minimum cycle time for such a sample-and-hold design is about twice the settling time of the feedback system employed. If a zero offset correction cycle is opted for, it also requires two settling time periods. However, if high impedance inputs are provided by the semiconductor/design methods employed for the inputs of the feedback system that is active in the hold mode, the zero offset value need only be measured and stored on an infrequent basis (i.e., thousand or even millions of samples), in which case this time overhead for zero offset is effectively eliminated. The same is true when employing a pre-computed value to use as an offset, say as for an S&H to be used in a recirculating A-D converter. In each case, the same offset is being subtracted in the hold mode and the selection to switch in the offset, as long as it is determined prior to the track-to-hold transition, can be done synchronously with the track-to-hold transition itself and, thus, will not increase the overall cycle time above two settling times of the feedback system employed.

An exact gain of two transfer function that does not depend on matched components or precision resistors can be obtained by using two capacitors to form a precision voltage doubler in the hold mode. In effect, each of two capacitors is charged with a replica of the input signal voltage in the acquisition mode. Upon transferring to the hold mode, the two capacitors are effectively "stacked" in the hold mode. However, rather than using series switches to accomplish the stacking a la voltage doubling power supply design methods that must transmit power to a load, the two capacitors are registered end-to-end, by virtue of both of them being connected to the differential inputs of a feedback system that uses them in the virtual ground configuration to maintain an accurate and stable output voltage in the hold mode. In this mode static and dynamic switch parasitics are cancelled out differentially to a mere common mode error to which any good differential system is immune.

BRIEF DESCRIPTION OF THE DRAWINGS

FIG. 1 is a block diagram that shows the minimum possible complexity current mode multiplexed amplifier implementation of the invention using a single external ground-referenced switch and a hold capacitor that registers the hold mode output voltage in a virtual ground configuration.

FIG. 1A shows the symbol employed to denote the elements shown in FIG. 1.

FIG. 2 is a block-schematic diagram that shows a current mode multiplexed differential transistor pair with two diodes in series with each output and clamping switches to reverse bias the diodes in the disabled stage for off node isolation of outputs.

FIG. 3 is a schematic diagram that shows how to switch the transconductance modulation of a differential amplifier to an essentially zero modulation state without changing average current output.

FIG. 4 is a schematic diagram that shows how to do current steering of two different output channels while one differential transistor amplifier is always active.

FIG. 5 is a schematic diagram that shows how to current mode multiplex a low quiescent bias/high linear modulation type transistor transconductance amplifier.

FIG. 6 is a schematic diagram that shows how to drive a complementary pair of Schottky clamped switches so that they have a well-balanced equal and opposite phase response.

FIG. 7 is a block-schematic diagram that shows how to current-mode multiplex a differential amplifier with a single-ended output including clamping reverse biased diodes for off mode output isolation.

FIG. 8 is a block diagram of a current-mode multiplexed amplifier with a single-ended output and differential capacitors and switches for hold mode stability.

FIG. 11 is a block-schematic diagram showing how to implement switches 19 and 21 of FIG. 10.

FIG. 12 is a block-schematic diagram of a current mode multiplexed S&H with resistively coupled differential signal inputs and differential outputs, including S&H clock driven sampling switches.

FIG. 13 is a block diagram of a current mode multiplexed S&H with a single differential signal input that is sampled and held on two separate outputs which are also differential and wherein the feedback control in the acquisition and hold modes is of the locally constrained feedback type.

FIG. 14 is a block diagram of a current mode multiplexed S&H with the ability to hold a zero offset correction voltage on CV2 as well as switches S6 and S7 which inputs zero volts in the tracking mode.

FIG. 15 is a block-schematic diagram of a current mode multiplexed S&H with inverting signal input coupling that can be set to zero as well as the capacity to hold two separate voltage values that can be subtracted from the hold voltage value such as is needed for zero offset correction and/or double correlated sampling.

FIG. 16 is a block diagram that shows a current mode multiplexed S&H with a single-ended output and a symmetrical configuration of switches and capacitors for holding three different voltage values such that when control is transferred to the hold mode it is possible to hold V1, V2 and V3 and wherein further compensation of the major switch parasitics is obtained by virtue of symmetry.

FIG. 17 is a schematic diagram that shows a way of using two differential transistor pairs to obtain locally constrained feedback between two differential signal sources.

FIG. 17A is the block symbol showing of the FIG. 17 circuit.

FIG. 18 is a block diagram that shows a current mode multiplexed S&H amplifier with locally constrained feedback in both the acquisition mode and the hold mode, fully differential outputs, capacity to hold three different voltage values and hold mode switches that allow for subtracting two of the values from the third, that is V1, V2 and V3, whereby the third value is subtracted outside the active feedback in the hold mode.

FIG. 19 is a block diagram that shows a current mode multiplexed S&H with fully differential input and output whereby two values can be sampled such that in the hold mode the first is doubled and the second is subtracted from the double of the first, the subtraction being accomplished outside the feedback loop in the hold mode, FIG. 20 is a block diagram of a CMM S&H with a "T" configured input signal switching arrangement for either noninverting signal acquisition or reference zero input. The hold mode feedback and switch arrangement is capable of a gain of one or two with compensation of switch parasitics and zero offset correction and 1 bit D-A converter offsetting in the hold mode.

FIG. 23 is a block diagram showing a noninverting acquisition mode S&H which can hold either an input voltage or one-half of the same voltage and zero offset correction and adding a precision voltage offset are also possible, as is needed for pipe-lined and recirculating D-A converter design.

FIG. 24 is a block diagram that shows a current mode multiplexed S&H with a total of three alternately multiplexed differential inputs and one single-ended output, a noninverting signal acquisition input mode with series and shunt switches enabling a zero voltage input condition for a zero offset correction cycle, two hold feedback channels, each of which is capable of outputting a sampled voltage with a gain of one, one-half, or two, each of which modes can be zero offset corrected and added or subtracted by a reference voltage as is needed for a dual mode recirculating (algorithmic) A-D/D-A converter configuration, whereby when one is holding the other can be sampling from the common output.

FIG. 25 is a block diagram of a complex S&H arrangement which has a total of four feedback control modes, one noninverting signal acquisition mode and three feedback modes, one of which has a gain of one and two of which have a gain of two. This method is almost a complete recirculating A-D converter.

DESCRIPTION OF THE INVENTION

Figure 9:
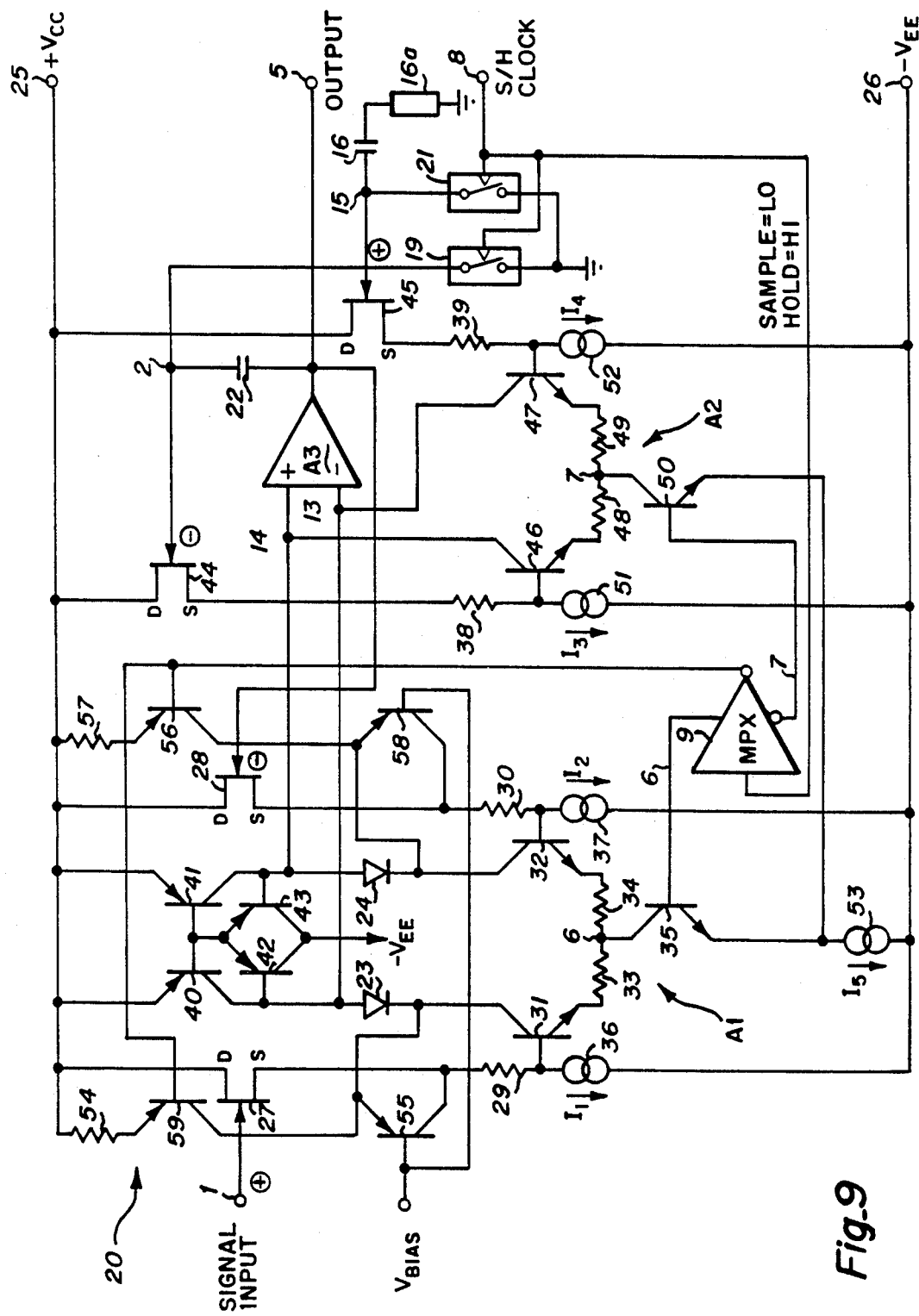
FIG. 9 is a block-schematic diagram of a circuit implementation of FIG. 8 suitable for hybrid IC construction.

FIG. 1 illustrates the basic concepts of the invention in their simplest possible form. The nomenclature used to identify A0 in terms of A1 which is the sampling amplifier, A2 which is the hold amplifier and A3 which is the output amplifier, will be reused in subsequent figures in order to emphasize the unity of the invention. A1 and A2 are high gain differential amplifiers with essentially identical characteristics and A3 can be almost any kind of amplifier which acts to sum the outputs of A1 and A2. A3 could even be a passive network including a direct connection between the outputs of A1 and A2. Specifically, A1 is active in the signal acquisition or tracking mode while A2 is deactivated. Preferred methods for activating and deactivating A1 and A2 are shown in FIGS. 2, 3, 4, 5 and 7. When only A1 is active, A0's output only reflects activity at the signal input. This is the tracking mode.

Differential amplifiers A1 and A2 can be implemented as shown in FIG. 2. This circuit can be employed in the A0 configuration to provide additional inputs. As many as needed for a particular application can be added as desired. For example, see FIGS. 13, 18, 19, 21, 24 and 25.

In order that the output voltage variations can be impressed on the hold capacitor CV1 (i.e., capacitor value 1), switch SV1 (i.e., switch for value 1) is actuated on to a low resistance state during the tracking mode. The time when the input voltage is actually sampled is when SV1 opens. It is preferred that SV1 opens quickly (for reduced harmonic distortion) and goes to an ultra-high resistance state before A2 is selected to control A0's output instead of A1. As a practical matter, this can be done by slightly delaying the signal at 7 with respect to that at 6. In this way, no spurious errors are introduced other than the errors that SV1's feedthrough charge to CV1. This effectively shields the voltage on CV1 from the inevitable switching transients associated with the transition of feedback control away from A1 and to A2. Only capacitively coupled charge will be injected to the hold capacitor during transition so long as SV1 has already switched off before A2 is selected and A1 is deselected. This and all the additional S&H configurations are just variations that comprise the design paradigm.

FIG. 1 provides a unity gain voltage follower transfer function for the A0 amplifier in the sample or acquisition mode. This will probably be the preferred choice, but it should be recognized that other arbitrary feedback configurations, including switch configurations to enhance isolation in the hold mode and/or provide for the coupling of a predetermined input voltage condition under feedback, such as zero volts input for offset correction capability, are all valid and useful possible feedback network configurations. Basically, any feedback arrangement that is possible for feedback amplifiers in general is also possible for the acquisition mode of such a current mode multiplexed S&H.

However, A2 is shown with the capacitively coupled feedback of the hold capacitor CV1. This aspect is emphasized because it always is necessary in this form in order this type of multiplexed S&H to register an accurate output voltage of the voltage sampled on the hold capacitor by the combined action of the closing and opening of SV1 with the A2, A3 series amplifier combination active with feedback and signal coupling. It must be recognized that it is specifically at the time when SV1 opens that the voltage at the output of A3 is sampled, but that, however, this sampled voltage is not held valid at A0's output until A1 is deactivated and A2 is activated, giving feedback control to the voltage value across CV1.

The overall current mode multiplexed amplifier A0 will always have a minimum of six external connections. At least one signal input coupling terminal, at least one inverting input terminal active in the hold mode, at least two power supply connections, at least a single-ended output drive terminal and at least one terminal which is functionally able to transfer control from the A1, A3 series amplifiers to the A2, A3 series amplifier by virtue of a current mode multiplexing action.

FIG. 2 is a block-schematic diagram showing a preferred example of how to activate and deactivate a differential voltage input/differential current output amplifier by either supplying or removing the current bias to the emitter coupled differential transistor pair Q1, Q2 and, thus, controlling the ability for Q1, Q2 to modulate current. Diodes D1-4 are forward biased by the active current outputs of the biased differential transistor pair Q1, Q2. Switches CS1-4 are shown open, but can be closed by the action of line 7 so that D1-4 are effectively reverse biased so as to pull up the cathodes of D1-4 to a voltage bias chosen to be more positive than the peak of the dynamic range of iOUT and +iOUT. While one diode would be operative, two diodes are shown in series with each current mode output because of the additional isolation afforded when in the deactivated state. In the active state the diode series resistance will be relatively low compared to the collector output impedance and will not significantly affect the speed of response of the modulation, as is critical when imbedded in a feedback amplifier, which is always the case for the current mode multiplexed amplifier systems used for this invention tracking, sampling and holding modes.

FIG. 3 shows a method of enabling or disabling modulation of current from a differential amplifier without affecting average output current. This would be useful if it was desired to bring the slew rate of the amplifier down to a very low value without actually activating a second channel of multiplexed feedback control, such as would be desired if other switching functions needed to settle before feedback control in the hold mode was activated. The method of FIG. 3 is to employ a total of three identical, differential amplifiers T1, T'1; T2, T'2 and T3, T'3. The T1 and T2 amplifiers have their current mode outputs connected in phase while T3, T'3 is cross-coupled to be 180 degrees out of phase. The six resistors shown have equal values thereby equalizing the three amplifiers. This allows the differential amplifier system to modulate when SM1 biases the emitters of T2, T'2. However, when SM1 steers current to T3, T'3, then the current mode outputs of T1, T'1 and T3, T'3 are equal and opposite, thereby reducing modulation down to almost zero regardless of differential input signal level. These two extremes of either full or zero modulation without any change in average current output, produce the desired result. This method of multiplexing can be combined with the method in FIG. 2 for added flexibility when needed.

FIG. 4 shows how to use current steering to alternately deliver modulation to two different sets of differential current mode outputs simply by toggling both MS1 and MS2 in synchronism between the two differential outputs −iOUT, +iOUT, and −iOUT2, +iOUT2. This type of current mode multiplexing has the advantage that the differential transistor pair that the signal is directly coupled to never experience significant switching transients at the base inputs −VIN and +VIN because their emitters are continuously biased (only the collectors see small transients). Capacitive loading at the signal inputs is minimized since a single differential transistor pair alternately delivers modulation to two different differential outputs.

FIG. 5 is a differential transconductance amplifier with two sets of differential current mode outputs iO1-2 (which sink current) and iO3-4 (which source current). The two pairs of complementary emitter coupled transistors TO1 and 3 and TO2 and 4 deliver this differential current by controlling the voltage across the resistor R that connects their respective common emitter connections CE1 and CE2, whereby their differential current mode modulation is determined. The base voltages between the two pairs of complementary emitter coupled pairs are determined by the base-emitter voltages of TI1 and 3 and TI2 and 4, respectively, which are themselves determined by a combination of the current biases at the emitters of the emitter followers TI1-4. The switches SVM1-4 are connected to the positive and negative voltage biases +VBIAS and −VBIAS, such that when the switches SVM1-4 are closed the base-emitter junctions of TI's are reverse biased as long as +−VIN is between +−VBIAS. The net result is that when SVM1-4 are open all eight transistors are active and the combination acts as a transconductance amplifier with inputs +−VIN and outputs iO1-4, and when the four switches (SVM1-4) close, all eight transistors are biased off when +−VIN is between +−VBIAS and no current is delivered by iO1-4, either differential or common mode. This type of multiplexing is called voltage controlled current multiplexing (VCCM), since the most immediate effect needed to change the current mode outputs at the collectors of TO1-4 is to control the base voltages of TO1-4, as opposed to CMM, such as in FIG. 2, where it is current to the emitters of the differential pair that enables or disables differential modulation of common mode current.

It should be noted that, by using three identical copies of the eight transistors in FIG. 5, it is possible to cross-connect the outputs of two of the three, as in FIG. 3, and, thus, multiplex only the differential modulation rather than the common mode current. Also, by duplicating the switches MS1-2, shown in FIG. 4, to include the negative going set of differentia current mode outputs iO3-4, it is possible to "steer" the modulated outputs to two or more output destinations. Likewise, the series diodes, shown in FIG. 2 for isolation, will work on the FIG. 5 current mode outputs as well.

With reference to FIG. 6, a schematic diagram shows a circuit that can be used to develop complementary multiplexing clamping currents. A PNP transistor, TSCP, provides a current source when turned on and NPN transistor, TSCN, provides a current sink action. Each of these transistors is Schottky-diode clamped and driven from the collectors of complementary transistors. This arrangement results in matched phase response for the clamping currents as a function of the input signals.

FIG. 6 is a time-balanced switching arrangement whereby the switch pairs SVM1 and 3 of SVM2 and 4, of FIG. 5, could be implemented for minimum switching transient errors when demultiplexing. Specifically, TiP and TiN are a complementary transistor emitter coupled switching pair shown with emitter resistor degeneration to limit the total current output from their collectors. If the differential control voltages P&NDMUX are well-controlled, then emitter degeneration might not be needed. In any case, the output currents on the collectors CP&N are guaranteed to be time synchronized by virtue of the fact that the current from each transistor TiP and TiN must pass through each other. With a reasonable $F_T$ match between these two complementary devices, this virtually guarantees perfect match in the time delays between the input and the two outputs. CP and CN are the inputs of two inverted which, in this specific case, are shown to be Schottky diode clamped inverting switches which act as voltage clamps when 'on' and are on a small capacitive load when 'off'. This is exactly what is needed for the switching functions of SVM1 and 3 and SVM2 and 4 of FIG. 5 and which guarantees, by the topography of the design, that the clamping functions will be almost perfectly time balanced and, thus the associated unbalanced switching errors will be minimized.

FIG. 7 is a schematic-block diagram showing a differential amplifier that has a single-ended output and isolation diode switching for the off state. T1 and T2 are emitter degenerated NPN transistors. PNP transistors T3 and T4 act as a current mirror load. Diodes D1 and D2 are biased on when T2 conducts and, thereby, provides low impedance output devices. When T1 and T2 are turned off, SD1 and SD2, respectively, reverse bias diodes D1 and D2, thereby making them open or high impedance so that the output will not load the circuit to which FIG. 7 is connected.

FIG. 8 is an expansion of FIG. 1 which shows both A1 and A2, with differential inputs, as is standard for operational amplifiers. Although there is still just one capacitor 22 (CPV1), which is actively driven in the signal tracking mode and which samples the input voltage when SV1 (19) changes from a low resistance to an open state, while A2 is active. When SV1 (19) open the input signal voltage is sampled on CPV1 (22) solely by that action alone. It is not necessary for A1 to become inactive and A2 to become active in order for sampling of input signal to occur. However, for a sampled signal voltage to be held and registered on the output of A0, it is necessary that A2 take control of A0 with CPV1 (22) then being the controlling element in the feedback loop as it is connected from the output of A0 and the inverting input of A2. At the noninverting input of A2 is the junction of CNV1 16 and switch SCNV1 (21). Although the voltage sampled on CPV1 (22) can be held and registered on A1's output, without SCNV1 (21) opening, it is much preferred that both SV1 and SCNV1 be open when the system is in the hold mode. This is because it is possible to have the switching errors associated with the closed-to-open transition of SV1 (19) duplicated by the CNV1/SCNV1 (16/21) combination. This is possible if the ratio of the capacitance of CNV1 (16) to the parasitic open state capacitance of SCNV1 (21) is equal to the ratio of the capacitance of CPV1 (22) to the open state parasitic capacitance of SV1 (19). With essentially equal control voltages used to actuate both SCNV1 and SV the result will be essentially identical charge feedthrough errors appearing on both CNV1 and CPV1. Since these error voltages appear at both inputs of the differential input amplifier A2 then equal error voltages are eliminated as common mode signal to the differential amplifier. In practice, CNV1 will be chosen to be essentially equal to CPV1, so that only the differential input bias current of A2 will generate a droop rate on the output of A0 in the hold mode. In this way, a large part of the absolute input current of the inverting input of A2 is effectively eliminated as a source of droop error.

The element 16a is meant to denote a linear or nonlinear complex impedance element that is meant to duplicate the output impedance of A0 when SV1 samples VOUT on CPV1 (22) with A1 active. In this way any unbalanced feedthrough of SV1 (19), which in part is determined by the output impedance of A0, will tend to be duplicated on CNV1 (16) as SCNV1 (21) opens. Even though CNV1 (16) is not capable of sampling any signal voltage it should be capable of sampling all error voltages that CPV1 (22) experiences and this can only be achieved if it sees similar charge feedthroughs and impedances of its respective terminals. In this regard, although FIG. 8 shows a single control signal actuating both SV1 (19) and SCNV1 (21), this is not absolutely necessary since it is the action of the differential amplifier A2 that establishes the hold mode output voltage. So long as both SCNV1 (21) and SV1 (19) have both been actuated with similar control waveforms by the time the output voltage is held, then the errors on the two capacitors will cancel, which is the essence of what good design requires.

It should be noted that although A0 is specifically shown to be a differential input amplifier and A1 and A2 are shown to have their differential outputs directly connected together and to A3's inputs, this is not necessary. For instance, A1 and A2 could each be single-ended output amplifiers, such as the FIG. 7 circuit, with their outputs directly connected, in which case their outputs would have to be enabled or disabled selectively in order to achieve the necessary tracking and holding functions. In practice, A1 and A2 will be single stage transconductance amplifiers and A3 will be an inverting second stage with Miller feedback for stability.

FIG. 9 is a schematic diagram showing the hybrid IC form of circuits preferred in performing the functions of the elements of FIG. 8. A dual power supply is employed. The first supply can be coupled + to $V_{CC}$ terminal 25 and − to ground. The second will be coupled − to $-V_{EE}$ terminal 26 and + to ground. Here the ground potential is determined by the relative voltage of the two supplies. Typically, output terminal 5 will be operated so that its quiescent level is at ground which is the potential at the noninverting input of diff-amp A1. Diff-amps A1 and A2 are implemented as differential FET-BJT amplifiers.

Signal input terminal 1 drives the gate of N-channel FET 27 which is operated as a source follower. Likewise, N-channel FET 28, which comprises the inverting input, is operated as a source follower with its gate returned to output terminal 5. These source followers have isolation resistors 29 and 30 in series with their sources and they are coupled to drive the bases of differentially connected bipolar transistors 31 and 32. Resistors 33 and 34 degenerate transistors 31 and 32 respectively and transistor 35 is a tail current source for op-amp A1. Constant current sources 36 and 37 respectively act as source follower loads for FETs 27 and 28.

Transistors 40–43 form a current mirror load for diff-amp A1. This same load is also common to diff-amp A2 and therefore comprises means for commonly coupling diff-amps A1 and A2 to op-amp A3. It can be seen that diff-amp A1 will have substantial differential stage gain. It will also have very high input impedance due to the FET elements 27 and 28. It is to be understood that while a FET source follower configuration is employed to drive a BJT differential pair in the preferred embodiment, other high input impedance circuits could be employed. For example, the input circuit configuration employed in the well known LM11 and LM108 IC devices could be employed to achieve high input impedance and high differential gain. Alternatively, an amplifier configuration exclusively employing complementary FETs could be employed.

Diff-amp A2, which is constructed to be virtually identical to diff-amp A1, includes FET source followers 44 and 45 coupled to drive the bases respectively of transistors 46 and 47 which are connected as a differential pair. Resistors 38 and 39 isolate the FET sources and resistors 48 and 49 degenerate the differential BJT pair which has its tail current provided by transistor 50. Current sources 51 and 52 respectively form the source load elements of FETs 44 and 45.

It will be noted that transistors 35 and 50 are differentially switched by multiplexer 9 in response to the action of the input at control terminal 8. Current sources 36, 37, 51 and 52 are preferably matched so that $I_1=I_2=I_3=I_4$ and current source 53 conducts $I_5$ which is preferably equal to $2I_1$. Thus, when either diff-amp A1 or A2 is operative the FET currents are substantially the same as the BJT currents.

When diff-amp A1 is on, transistors 31 and 32 each conduct $I_5/2$. These currents will also flow through diodes 23 and 24 which are therefore forward biased and of low impedance. These diodes are present to perform the switch function described in connection with FIG. 2. Clamp circuit 20 is employed to reverse bias diodes 23 and 24 when diff-amp A1 is to be turned off. This then isolates diff-amp A1 from the differential signal lines driving op-amp A3. Multiplexer 9 provides a signal to the bases of transistors 56 and 59 in response to the control signal at terminal 8. In the sample mode the bases of transistors 56 and 59 are high or close to $V_{CC}$. The emitter of transistor 59 is returned to $V_{CC}$ by resistor 54. Accordingly, transistor 59 is off and no current will flow therein. As a result, transistor 55 will be nonconductive. Likewise, transistors 56 and 58 will be nonconductive. Thus, diff-amp A1 will operate normally and its output will drive op-amp A3.

In the hold mode the bases of transistors 56 and 59 are pulled about two volts below $V_{CC}$ by multiplexer 9. This will turn transistors 56 and 59 on. Since transistor 35 is off in this mode, no current will flow in transistors 31 and 32. The base of transistor 55 is biased at about 2.5 volts below $V_{CC}$ or at a nominal 12.5 volts. Conduction in transistor 59 will pull the emitter of transistor 55 up to a $V_{BE}$ above 12.5 or about $-13.1$ volts. Transistors 58 and 55 will then conduct $I_1$ and $I_2$ so that current no longer flows in FETs 27 and 28. This means that the cathodes of diodes 23 and 24 will be at slightly over 13 volts which is sufficient to ensure they will be reverse biased at all analog input signal levels.

If desired, diff-amp A2 could be provided with similar switch diodes and a similar clamping circuit to control its off state. However, this is not necessary because the input to diff-amp A2 is always close to ground potential and a signal range does not need to be accommodated. Furthermore, it can be seen that when transistor 50 is off, diff-amp A2 will not, under any signal condition, load the input of op-amp A3.

It is to be understood that while the switches shown FIG. 2 are preferred to be diodes, other switch means, along with suitable control circuitry, could be employed. For example, the switches could be JFET or BJT devices.

Figure 10:
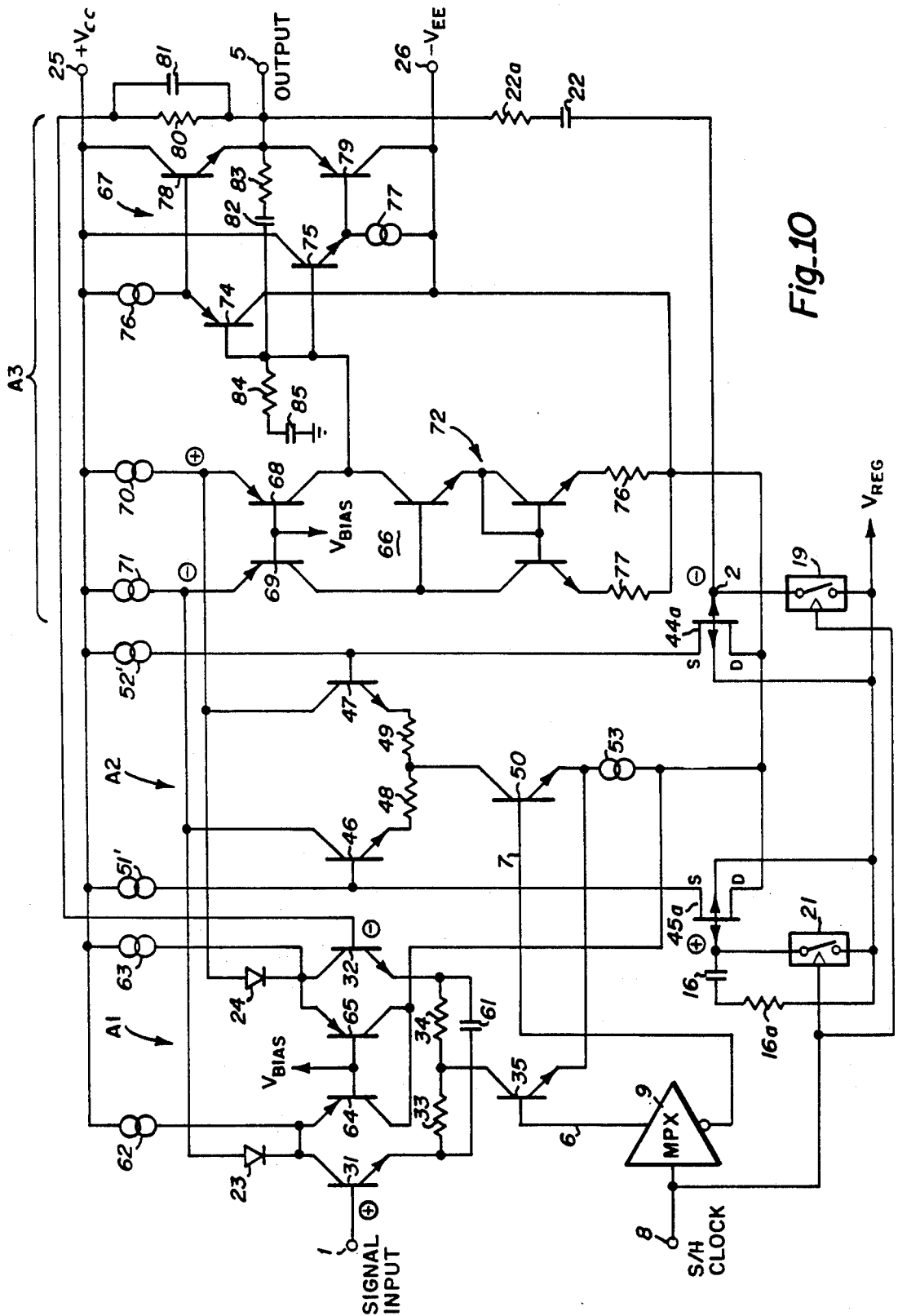
FIG. 10 is a block-schematic diagram of a circuit implementation of FIG. 8 suitable for monolithic iC construction.

FIG. 10 is a schematic diagram of a circuit that is useful in a monolithic IC version of the invention. The transistors should be manufactured by the process disclosed in U.S. Pat. No. 4,940,671 which issued Jul. 10, 1990, to J. Barry Small and Matthew S. Buynoski. This patent is titled A HIGH VOLTAGE COMPLEMENTARY NPN/PNP PROCESS and is assigned to National Semiconductor Corporation. It shows how high performance NPN and PNP transistors can be simultaneously fabricated into a conventional PN junction isolated, epitaxial, monolithic, IC wafer. The teaching in this patent is incorporated herein by reference. IC devices employing the patented process have been trademarked as the VIP ™ IC for vertically integrat PNP.

Where the circuit elements are similar to those of FIG. 9, the same reference designations are used. For example, the power supply terminals 25 and 26 respectively define the positive and negative supply polarities, terminal 5 is the single-ended output, terminal 8 is the sample/hold control signal terminal and terminal 1 is the input terminal for a noninverting sampling circuit configuration. As an alternative, the base of transistor 31 can be grounded and the base of transistor 32 coupled to input terminal 23 by way of a resistor that matches the value of resistor 80, which is connected between output terminal 5 and the base of transistor 32. This configuration will produce a unity gain inverter operation for the sampling circuit.

Diff-amp A1 is similar to that of FIG. 9 except it does not use FET's to isolate its input. The base of transistor 31 comprises the noninverting input which is directly connected to input terminal 1. The base of transistor 32 comprises the inverting input of diff-amp A1.

The emitters of transistors 31 and 32 are degenerated by resistors 33 and 34. Capacitor 61 couples the emitters together for high frequency signals. This capacitor can be formed as taught in U.S. Pat. No. 4,758,873 which issued Jul. 19 1988 to Dennis M. Monticelli. This patent is assigned to National Semiconductor Corporation and shows how a balanced coupling capacitor can be formed in an IC wafer and how it can be protected from electrostatic discharge (ESD) transients. The teaching in this patent is incorporated herein by reference.

Switch diodes 23 and 24 are respectively coupled in series with the collectors of transistors 31 and 32 and act as switches coupling elements to op-amp A3. Current sources 62 and 63 supply collector currents to transistors 31 and 32 and to the emitters of transistors 64 and 65 when transistors 31 and 32 are turned off. Transistors 64 and 65 are biased by $V_{BIAS}$ which is operated at about three diodes below $+V_{CC}$. Thus, at 300°K and a $+15$ volt $V_{CC}$, $V_{BIAS}$ will be at about 13.2 volts. When tail current supply transistor 35 is turned off by multiplexer 9, the collectors of transistors 31 and 32 will be pulled up along with the emitters of transistors 64 and 65. This will cause transistors 64 and 65 to conduct the currents flowing in sources 62 and 63 so that they no longer flow in transistors 31 and 32. This forces diodes 23 and 24 off (they no longer conduct). This high impedance state for diodes 23 and 24 causes them to act as isolation elements so that transistors 31 and 32 are no longer coupled to op-amp A3. However, when transistor 35 is turned on by multiplexer 9, the conduction in transistors 31 and 32 will pull their collectors down so as to turn diodes 23 and 24 on so they will couple transistors 31 and 32 to op-amp A3. Thus, the action of the multiplexer 14 switches diodes 23 and 24 by way of transistors 31 and 32.

Diff-amp A2 is a close approximation to the version disclosed in FIG. 9. However, P channel transistors 44a and 45a are employed as source follower drivers for transistors 47 and 46. Current sources 51' and 52' act as source loads respectively for transistors 45a and 44a. Transistor 44a is the inverting input to diff-amp A2 and 45a is the noninverting input. Both FETs are shown as a P channel FET with its back gate returned to $V_{REG}$.

Such a device can be fabricated as an ion-implanted FET tetrode structure with an isolated back gate.

Transistors 46 and 47 are differentially connected and degenerated by resistors 48 and 49 conventionally and are supplied with tail current by transistor 50 which is operated complementarily with transistor 35 by multiplexer 9. The collectors of transistors 46 and 47 are directly connected to the input of op-amp A3.

The gates of transistors 44a and 45a are operated by switches 21 and 19 as was the case in FIG. 9. However, these switches are returned to a source of regulated voltage, $V_{REG}$, instead of ground. This is due to the fact that the P channel FET's need to have their gates operated at a positive potential in order to turn them on. As a practical matter the source of $V_{REG}$, while not shown in FIG. 10, can be a zener diode reverse biased by means of a current source so that it operates in breakdown. These elements being conventional are not shown in detail.

When diff-amp A2 is operating, by virtue of the current flowing in transistor 50, current sources 51' and 52' will pull the bases of transistors 46 and 47 to a transistor threshold, $V_T$ above $V_{REG}$. When transistors 46 and 47 are turned off, due to the cessation of current in transistor 50, switches 21 and 22 will be closed and the gates of FETs 44a and 45a will be at $V_{REG}$. For this condition there will be no possibility of signals for the FETs and transistors 46 and 47 will have their bases pulled low. Thus, transistors 46 and 47 do not need to be decoupled from op-amp A3 input.

Op-amp A3 itself is composed of a high voltage gain input stage 66 and a high current gain output stage 67. The emitter of transistor 68 comprises the noninverting input and the emitter of transistor 69 comprises the inverting input. Matched current sources 70 and 71, which supply the currents flowing in transistors 68 and 69, in combination provide a current that exceeds that of source 53 by the quiescent current of stage 66. The bases of transistors 68 and 69 are commonly returned to $V_{BIAS}$ so that they operate as high voltage gain common base amplifiers. A conventional Wilson current mirror 72 acts as the load for transistors 68 and 69. This load converts the differential input from transistors 68 and 69 to a single-ended output that drives transistors 74 and 75. Resistors 76 and 77 are present to balance the Wilson current mirror and are typically trimmed to achieve such a balance.

Transistors 74 and 75 are complementary emitter followers and are operated respectively by current sources 76 and 77. Transistors 78 and 79, the output transistors, are also complementary emitter followers and are driven complementarily by transistors 74 and 75. Each of transistors 74, 75, 78 and 79, which comprise the output buffer stage, are operated as emitter followers to drive terminal 5 thereby providing unity voltage gain. Their combined current gain is Beta$^2$ which will typically be on the order of 40,000. This high current gain output stage in combination with the voltage gain of stage 66, provides extremely high overall gain for op-amp A3.

Hold capacitor 22 with a series antiringing resistor 22a is coupled between output terminal 5 and the inverting input of diff-amp A2. Dummy capacitor 16 with its series resistor 16a, as was described with reference to FIG. 8, is coupled between the noninverting input of op-amp A2 and $V_{REG}$.

Resistor 80 couples output terminal 11 to the inverting input of diff-amp A1. This overall negative feedback is substantially one hundred percent and is frequency compensated by capacitor 81. Resistor 83 and capacitor 82 frequency compensate output stage 67. Resistor 84 and capacitor 85 act to fully frequency compensate op-amp A3.

FIG. 11 is a schematic diagram of an implementation of switches 21 and 19 of FIG. 10. These switches are operated from the logic present at terminal 8 which is referenced to the potential applied to terminal 86. The logic is operated so that when terminal 8 is low switches 21, and 19 are on and when terminal 8 is high, switches 21 and 19 are off. The switching operation is referred to $V_{REG}$ which is the potential at node 87. $V_{REG}$ is produced, in the preferred embodiment, by means of voltage regulator 88. This regulator may be of the well known zener diode form described above.

Switch 19 is nominally composed of complementary transistors 89 and 90, while switch 21 is composed of complementary transistors 91 and 92. The switch transistors are operated from bias diodes 93 and 94 which are commonly returned to $V_{REG}$ node 87 by means of low value resistor 95. When diodes 93 and 94 are forward biased switches 21 and 22 will both be on with their outputs at terminals 96 and 97 clamped at approximately $V_{REG}$. Diff-amp 98 is operated differentially by means of the logic at terminal 8. Current sources 99–101 complete the elements of diff-amp 98. When the logic at terminal 8 is low (the sample mode) the current in source 99 will flow through diode 93 to node 87. Since current source 101 will return diode 94 to $-V_{EE}$ at terminal 26 by way of a conducting NPN transistor, it too will be conductive. Both diod 93 and 94 being conductive transistors 89–92 will be turned on thereby forcing switches 21 and 19 on. In this mode, terminals 96 and 97 will be clamped at close to $V_{REG}$.

In the logic state where terminal 8 is high, for the hold mode, current source 101 will pull the emitter of transistor 102 low, by way of the conducting NPN transistor. This will turn transistors 89 and 91 off. Current source 100 will pull the emitt of transistor 103 up so as to turn it on and therefore turn transistors 90 and 92 off. Bias voltage sources 104 and 105 are poled to respectively bias transistors 102 and 103 off. Thus, the emitters of transistors 102 and 103, when turned on, will be respectively clamped at $V_{BE}+V_1$ below node 87 and $V_{BE}+V_2$ above node 87. These bias values are selected to ensure that transistors 89–92 will be off for any reasonable potential level at terminals 96 and 97. Thus, when switches 21 and 19 are off (in the hold mode) terminals 96 and 97 can be fluctuating to a degree and still provide the required circuit action.

If the above described switch circuit is to be employed with the switches of the hybrid circuit of FIG. 9, the only difference is that node 87 will be returned to ground rather than $V_{REG}$. For this configuration terminals 96 and 97 will clamp close to ground.

FIG. 12 is just slightly more complex than FIG. 8 whereby A0 is shown with differential outputs which allows CPV1 and CNV1 to be actively driven. In this case, it makes sense to include an additional switch SV1D between what are now the two active hold capacitors CPV1 and CNV1. If the overall amplifier A0 is designed to have its outputs symmetrical about ground (or some other reference voltage) then SV1D will be all that is needed to sample an AC differential signal voltage on CPV1 and CNV1 in which case SV1 and SCNV1 will only establish DC common mode voltages. I this case, because SV1D automatically distributes it's error feedthrough charges equally on CPV1 and CNV1, it is preferred to make SV1D the larger sampling switch with SV1 and SCNV1 only large enough for establishing a DC level at the inputs of A2. Also, please note that it is possible to open SV1 and SCNV1 before SV1D opens and yet still SV1D will control the voltage sampled by the hold capacitors and that this remains true even when A0 is a single ended output. This is to say, it is not necessary to restrict the use of a switch directly connecting the two hold capacitors to a differential output configuration; it is also valid for FIG. 8. The only difference is that when A0 is single-ended and SCNV1 and SV1 are opened before SV1D, then the inputs of A2 will experience common mode signal as VOUT varies after SV1 and SCNV1 open, but the differential voltage sampled by SV1D's action will still be registered arcurately as long as A2 has a good common mode rejection ratio. It should be noted that SV1 and SCNV1 do not have to be in series with a fixed voltage bias. One could choose to use a two-to-one divider from the single-ended output of A0. The only disadvantage that this would represent is that the switch SV1D would experience amplitude variations amounting to one-half of the signal excursions and would thus probably experience some systematic aperature time jitter error. Also, only one of SV1 or SCNV1 are actually needed to establish a DC level for the inputs of A2. Alternately, switches could be placed in parallel with both CPV1 and CNV1 and used to bring the voltages across both of the capacitors to zero volts before signal tracking is initiated by SV1D switching to a low resistance and A1 inside A0 being active. In this way, when SV1D is closed CPV1 and CNV1 will perform as a capacitive divider and automatically set the input range for A2. This would probably not usually be preferred because of the extra time needed each cycle to zero the hold capacitor voltages before initiating tracking, it only serves to illustrate the flexibility of this configuration and the variety of ways that the basic differential hold capacitor configuration can be dynamically exercise.

FIG. 13 is a slightly more complex sample of how to use current mode multiplexing to alternate control of a differential signal input in such a way as to be able to alternate signal output registration between two different differential signal output amplifiers A3 and A'3. This type of input to output signal multiplexing control is accomplished, in this case, by employing just a single differential amplifier AA'1 for direct signal input. Amplifier AA'1 is designated to have two pairs of differential signal outputs that are selectively activated under the control of the S/H controls 9 and 9A. FIG. 4 is a good way to implement the necessary switching. Notice that each time AA'1 is routed to A'3 then A'1 must also be enabled in order for there to be feedback that guarantees an accurate representation of the voltage inputs AA'1 to the outputs of A'3 and S'V1 must be closed to impress this voltage across C'NV1 and C'PV2. Likewise, each time the AA'1 is activated to control A3, then A1 must also be activated and SV1 must be closed. The transition from tracking to holding is initiated by first opening either SV1 or S'V1 and then transferring control to A2 or A'2. In other words, the tracking to holding transition is made in the usual way, but with two choices of output from one signal input. The system as shown in FIG. 3, can only alternate between tracking and holding between two output amplifiers. While one is sampling the other is holding. By allowing for a different type of operation and control of AA'1 it would be possible for A3 and A'3 to sample the same input signal value simultaneously, although it is not apparent why one would want to do this. What would probably be more useful would be to have two separate signal input capabilities that were selectively multiplexed to a single-output amplifier so that a representation of either signal source could be held as an output voltage. This is, in fact, what is needed to first introduce a signal into a recirculating AD converter from an external signal source after which the internal recirculating path is the one that needs to be active until the recirculating AD conversion process is completed. Notice that in the interest of clarity, the shunt switches, SV1P and SV1N from FIG. 12, are omitted from FIG. 13.

FIGS. 12 and 13 are more realistically representative of the type of symmetrically coupled hold capacitor configuration is preferred to obtain differential cancellation of switch transistion feedthrough. A1 and A2 are shown to be differential input, differential output amplifiers that are both capable of actuating A3's inputs, depending on which of A1 or A2 is enabled, which, of course, determines whether the system is operating in the signal acquisition mode or the hold mode. The choice is made to label the switch between the two hold capacitors SV1, while the two switches the ground reference the hold capacitors are labeled SV1P and SV1N. This is to emphasize that, in this particular configuration, SV1 should be larger and is, in fact the primary switch during signal acquisition compared to SV1P or SV1N. This is true because when CPV1 and CNV1 are matched capacitors and VNOUT and VPOUT are being driven symmetrically about a zero reference with both AC and DC symmetry, then the grounded switches are only needed for establishing the absolute DC level at signal nodes. Because the charges injected into SV1 by CPV1 and CNV1, under conditions of dynmamic signal acquisition when A1, A3 is active, are equal and opposite the DC voltages will not vary with a symmetrical drive through the hold capacitors. Thus, once the DC values are established SV1P and SV1N could be switched open and SV1 would successfully impress the differential voltage from VNOUT, VPOUT upon the hold capacitors. Even if the averaged DC values at the inputs of A2 are not exactly as planned it will not affect the accuracy of the hold mode output voltage because A2 will ignore the common node signals and only respond to the differential signals that SV1 successfully impresses on the hold capacitors. However, if the output of A3 is chosen to be single-ended, instead of differential, then SV1 becomes irrelevant and SV1P becomes the primary switch that absorbs AC current in the signal acquisition mode. In this case NVOUT becomes ground and CNV1 becomes a "dummy" capacitor whose main function becomes cancelling the spurious charge injected into CPV1 by SV1P's transition from track to hold (i.e., closed to open). In this case, it is preferred to shunt CN to ground with an impedance that mimics the high frequency impedance of A3 so that when both SV1P and SV1N switch the capacitor/impedance combinations represented by the two HOLD capacitors are essentially equal. This is necessary because the switching transients of SV1P can couple to A2 before SV1P opens, in which case a spurious voltage will be impressed across SPV1. In order for differential cancellation of such spuricus signal injection to be effective, the same spurious signal must be impressed on CNV1 as CPV1. This only happens it CNV1 is terminated or driven by a similar impedance as CPV1.

FIG. 14 illustrates one of the simplest possible ways to use the basic configuration of FIG. 1 to achieve either zero offset correction capability or double correlated sampling, but not both simultaneously. Later diagrams will introduce additional complexities needed to offset correct two samples to be subtracted or added and/or how to implement offsetting DA converter capabilities for this species of S&H design. This configuration can do D-A converter offsetting as well by including switches connected between the junction of CV2/HS-V2 and preselected reference voltages so that when such a switch is activated in the hold mode the reference voltage is added in series with the offset correction across CV2, thus offsetting the noninverting input of A2 in the hold mode whereby the output voltage is offset by the reference voltage thus selected.

S6, which is in series with the SIGNAL INPUT and the noninverting input of A0 is operated exactly out of phase with S7 which shunts the noninverting input of A0 to ground (or some other reference voltage). In this way, the out of phase operation of S6 and S7 gates either the SIGNAL INPUT or a reference voltage to A0' noninverting input. In this simple case, to start a zero offset correction cycle S6 is off and S7 on. As A0 active for sampling and SV1 on. This puts the system in the tracking mode with zero volts controlling operation. When SV1 opens the total error voltages of the offset of the A0 amplifier, as well as the charge feedthrough pedestal errors of SV1's opening, will be sampled as the voltage on CV1. Next, SV2 is closed and control is transferred to A0 in its hold mode. The voltage now on the output of A0 will be the sum total of A0's offset errors, SV1's charge feedthrough error and the hold mode of A0's offset errors, assuming that SV2 is a zero offset error switch such as CMOS. While these total error voltages are being exhibited on the A0 output, SPV2 is closed with HS-V2 open. This acquires the total error voltage on CV2. If next both SPV2 and SV2 are opened, the sampling the total error voltages of the tracking, sampling, holding operation of the combined system on the capacitor CV2. If next, HS-V2 is now closed, then the negative of the total error voltages is seen at the positive input of the active amplifier A0 in its hold mode with CV1 in the inverting ground position and holding the positive total error voltages. In this way, the overall errors of the S&H system have been reduced to zero. Of course, no error cancelling system can be perfect, otherwise, we could build essentially zero noise amplifiers. Finite errors are introduced by unbalanced charge feedthrough of SV2 and SPV2 as they open as well as differences in the capacitive divider ratios between CV1 and CV2 and their respective total shunt capacitance that will be dynamically exhibited when HS-V2 closes and the dynamic action of A0 forces a voltage step at the junction of CV1 and SV1 equal to the step experienced at the junction of CV2 and SV2 by the action of HS-V2 closing with the error voltage on CV2. That is to say, as HS-V2 closes and offsets the A0 system, by the error sampled, the degree to which this is done with fidelity is dependent on equal capacitive divider action of both CV1 and CV2. In this way, CV2 should be chosen to be equal capacitance to CV1 and switch SV1 should be equal in size to SV2.

Once such a compensating error voltage is sampled on CV2, it can be used to correct the DC errors associated with the operation of the overall S&H cycle. This is done by opening S7 and closing S6, activating the sample function of A0, and closing SV1 in order to track the input signal on CV1. JS-V2 can remain closed during signal tacking so that the offset correcting signal is then available to correct the sampled voltage in the hold mode.

Alternately, if desired, SPV2 and SV2 can be closed to track an input signal voltage and sample it on CV2. A second voltage could also be sampled on CV1. Subsequently, when HS-V2 is closed and the hold mode of A0 is activated the output voltage of the system will be the difference between the voltage sampled on CV1 and CVZ plus the total error voltages associated with the two sampling operations and registering their difference in the hold mode. For offset correcting of a double correlated sample, a more complex configuration is needed.

FIG. 15 is capable of this because of the addition of a third capacitor CV3. The inverting input switching configuration S6–9 is only meant to demonstrate a good method of input signal multiplexing with an inverting amplifier for signal tracking. The shunt switch S7 is only needed to clamp possible signal input feedthrough through the input resistor. When S6, S8 and S9 are closed, and A0 in its sampling mode is active, then the overall signal amplification is inverting. When S6 and S8 are open and S7 closes (with S9 always closed) then a zero input signal condition is imposed on A0. It should be noted that to correct the DC offset of the sampled and held difference between two subsequent samples, one does not need to have the two samples equal to any particular value. Theoretically, as long as the two samples were taken at the same time on CV1 and CV3, then their difference should be zero. it is not then the error can be held on CV2 and later subtracted correct subsequent double correlated samples. Because the overall operation of this many switches can be hard to follow through a verbal description. A state table is typically provided for the sequence required for the various functions of signal sampling, error sample and error corrected holding. For example, see thed APPENDIX that appears at the end of this specification. Such tables are much easier to keep track of and will be used for all the more complex example to follow in order to allow the written description to concentrate on those aspects of design that require more detailed consideration than a table can reveal. For instance, because the final offset corrected double correlated sample is registered by closing HS-V2 -V3, it is necessary to carefully select the sizes of the capacitor CV1-3 in relation to the open state parasitic capacitances of SV1-and any other parasitic capacitances at the hold inputs of A0 and at the juncture of CV2 and CV3. Specifically CV2 and CV3 will each be at least twice as big as CV1 so that the net voltage divider ratio at their juncture from VOUT is the same as the voltage divider ratio at the noninverting input from the juncture of CV2 and SPV2. This can only be done to within a linear approximation because the switches will, in general, be nonlinear capacitors in their off states, whereas the capacitors will be substantially linear. Such elements cannot be balanced perfectly and, in fact, there is not just one set of capacitor values for CV2 and CV3 that will work. The most relevant design criteria will be to minimize the total capacitor size in order to minimize die area, assuming that the capacitors are manufactured as on chip capacitors. An additional complexity of on chip capacitors is that one terminal of the capacitor will have considerably more shunt capacitance to ground than the other terminal simply because one side of the capacitor will be attached to the surface of the die with a dielectric layer of its own, whereas the other terminal of the capacitor will be the very surface of the die and only see a small air dielectric. This means that either of the junctures of CV2 and CV3 and/or the inverting input of A0 will have a parasitic shunt capacitance to ground which is part of the on chip capacitors fabricated structure. This means that it might be preferred to make inverting A0 input the terminal of CV1, which has the shunt parasitic capacitance to group associated with its on chip manufactured structure, in order to achieve a capacitive divider ratiometric match between the series capacitors CV2, CV3 and the individual capacitor CV1. These design choices are best made based on detailed simulations made with accurate models, preferably with the help of a general purpose optimization program to automate the process component sizing for maximum accuracy with a minimum capacitor size, etc.

FIG. 16 shows a very symmetrical switch and capacitor configuration that is self-compensating for switch parasitic capacitances even if A0 is operated as a single-ended amplifier as shown. For simplicity, an input signal multiplexing system, similar to FIG. 14, is depicted and the state table is set forth in the APPENDIX. The objective here is to hold three distinct signal voltages on the pairs of differential capacitors CNV1/CPV1, CNV2/CPV2 and CNV3/CPV3. Two of these will be actual signal voltages, usually V1 and V2, while the third, V3, on CNV3/CPV3 will be a compensating error voltage needed to null the inevitable DC errors involved in sampling and outputing the difference of V1−V2. To do this, we first open S6 and close S7 so as to multiplex into the A0 hold mode active amplifier a zero volt input, in which case there will be an error voltage exhibited at A0's output. This voltage is sampled and held in the following way: DSPV1, V2 and DSNV1, V2 are always open. They are dummies that are only used to compensate the parasitic switch capacitances of SPV1, V2 and SNV1, V2 when they are open. To start SN(V1, V2), SP(V1.V2), SV1 and SV2 are closed. This captures identical differential voltages on the pairs of differential capacitors CNV1. CPV1 and CNV2.CPV2. Upon this being accomplished the switches SN(V1.V2), SV1.SP(V1.V2) and SV2 are now opened and SNV3 and SPV3 are closed, upon which event control of A0 is transferred to the hold combination which exhibits the overall error signal of V1−V2 in the hold mode. This error is impressed on the differential pair of capacitors CNV3 and CPV3 by closing SV3. Remember that SNV3 and SPV3 are closed while the zero reference V1−V2 value is being exhibited. This makes it possible to use the closing of SV3 to capture, on CNV3, CPV3, the overall double correlated sampling error being exhibited and, thus, making it available for future us as a zero correcting offset upon first opening SNV3, SPV3 and then closing HSN(V1-V2-V3) and HSP(V1-V2-V3).

With a differential error cancelling voltage now held on CNV3, CPV3, it is now possible to proceed with double correlated sampling that can be zero offset corrected. First, HSN(V1-V2-V3) and HSP(V1-V2-V3) are opened and direct SIGNAL INPUT is restored by opening S7 and closing S6. Next, two input signal voltages are impressed on the two pairs of differential capacitors CNV1, CPV1 and CNV2, CPV2. This is accomplished by keeping SN(V1, V2) and SP(V1, V2) closed while SV1 and SV2 are closed and opened to sample two voltages, V1 and V2, on their corresponding differential HOLD capacitor pairs. After this is accomplished, SN(V1, V2) and SP(V1, V2) can be opened and HSN(V1-V2-V3) and HSP(V1-V2-V3) closed and control of A0 transferred to the A3 feedback hold mode of operation. This sequence will provide reasonably accurate hold mode voltage registration. The parasitic capacitance of SV2 is not compensated, but can be "pulled" out of the error equation by judicious operation of SNV3 and SPV3. Specifically, if before the HSN/P(V1-V2-V3) switches are finally actuated, the SNV3, SPV3 switches are operated first instead, then the parasitic capacitance of SV2, in the off state, will be "pulled" by the closing of SNV3 and SPV3, in which case then the opening of SNV3, SPV3, followed by the closing of HSN/P(V1-V2-V3) will not introduct a large parasitic error because the error voltages associated with V3 are relatively small.

The distinguishing features of this configuration are the use of sets of two HOLD capacitors and three switches in series with them, for each signal voltage value to be sampled, the use of completely passive dummy switches to compensate switch parasitics when holding a double correlated sample and the use of capacitors in series with symmetrically disposed switches at their terminals to accomplish the various functions of tracking, sampling and holding three separate voltage values, two of which will usually be signal and one of which will usually be an offset correction voltage value. There are numerous ways to configure and actuate such sets of switches and capacitors in order to accomplish double correlated sampling and offset correction.

FIG. 17 is a very simple arrngement of four transistors that provide two independent sets of differential inputs, V1-V2 and V3-V4. FIG. 17A is the symbol equivalent. This particular cross-coupled arrangement, although it does not provide absolute isolation between the two differential ports (because the two emitter degeneration resistors provide coupling between emitters and, thus, the bases of V1 and V3, as well as V2 and V4) is still potentially useful if the two differential signal inputs are eaoh symmetrical about the same reference voltage value. Typically, differential output amplifiers have symmetrical outputs because the common mode signal can be controlled by a feedback system independent of the feedback control of the differential value. In this way, one can get the noise immunity advantages of differential signal coupling without reducing the differential settling time yet still get the benefit of symmetrical signal excursions. The advantage here is that if one switches in a DC offset to one differential input pair, say V1-V2, then when the system is serving as the nulling amplifier in a feedback system with differential symmetrical outputs connected to V3, V4, there will be no differential current modulation from either differential pair when the system is nulled. This means that so long as the differential input signals are symmetrical, the matching between resistors is non-critical to the accurate nulling of the overall differential signal system. Differential output amplifiers are usually very good at providing symmetrical AC performance so that removing residual common mode errors with a second feedback system does not significantly disturb the differential value that is, of course, the real signal in a differential output signal amplifier.

FIG. 18 shows an almost identical capacitor switch configuration, but which has been modified to take advantage of the increased flexibility of using dual differential nulling, as the amplifier arrangement of FIG. 16 would provide, for locally constrained feedback control. The state table is set forth in the APPENDIX. The main difference here is that the holding and off-setting of the V3 value is isolated from the capacitor/switch configuration that holds V1–V2 by virtue of employing the full flexibility of the two sets of differential inputs afforded by dual differential locally constrained feedback. Notice, that when HS-V3 is closed and the open SV3 experience a change in bias voltage, which divides its parasitic capacitance into CNV3, CPV3, that, by the action of feedback, the same offset effect occurs on CNV1 and CPV1, allowing for very accurate HOLD node subtracting and offsetting with small capacitors. In practice, the switch HS-V3, rather than floating as shown, should rather be two switches which clamp each of CNV3 and CPV3 to the same reference voltage which the differential outputs of A0 are symmetrical in relation thereto. In this way, both of the differential inputs of A0, in the hold mode, will be symmetrically disposed about the same reference voltage as is needed for the amplifier of FIG. 17, to have the advantage of reduced sensitivity to the match of the emitter degeneration resistors. The distinguishing features of this configuration is the use of locally constrained feedback in the hold mode in order to accomplish offset correction or double correlated sampling with exact cancellation of switch parasitics by virtue of duplication of structure at the critical differential input pairs.

FIG. 19 uses the same offset correction method as FIG. 18, but shows a method of achieving a precision gain of two in the HOLD mode. This is accomplished by driving the input voltage on two capacitors, CPV1 and CNV1, in parallel when in the tracking mode. Table I shows the switch states for the various circuit function or conditions. Note that the entry DC means "don't care".

CPV1 and CNV1 is eliminated. Please note that because the voltage is exactly doubled each hold capacitor sees exactly half of the total output hold voltage because of the fact that they were both charged in parallel. Because of this "predictability" in the relationship between the sampled voltage and the voltage registered in the hold mode (exactly twice the sampled voltage), it is possible to use even more sophisticated methods to compensate even more of the total switch parasitic capacitances that distort the hold mode voltage. For instance, FIG. 20 is a single-ended implementation of a voltage doubling S&H that reverses the feedthrough charge of the main series sampling switches 1/2SV1.1 and 2/2SV1.1 by the equal and opposite action of 1/2SV1.2 and 2/2SV1.2. The distinguishing features of FIG. 19 are the use of two parallel switches, one of which is a "T" switch configuration in series with each of two hold capacitors such that when multiplexed feedback control is transferred to the hold mode and the output voltage is doubled, then the various charge feedthroughs associated with this doubling transition itself are compensated by the "T" switch configuration injecting an equal but opposite charge to the single series switch in parallel with it. The operation of CV2 and CV3 are similar to previous figures whereby offset correction information is held on CV2 and a one bit DA offset can be accomplished by switching CV3 into the hold mode. It should be noted that 2/2CV1 is larger in relation to its series switches, that is 1/2CV1 in relation to its series switches. This is necessary so that when CV2 is switched in during the HOLD mode so that the voltages across both CV2 and 2/2CV1 are seen added at the noninverting input of A2. Then, the total divider ratio between the two capacitor/switch configurations, at the inputs of A2, will be essentially equal as is needed for accurate registration of a hold mode gain of two with offset correction and offsetting DA capabilities.

Figure 21:
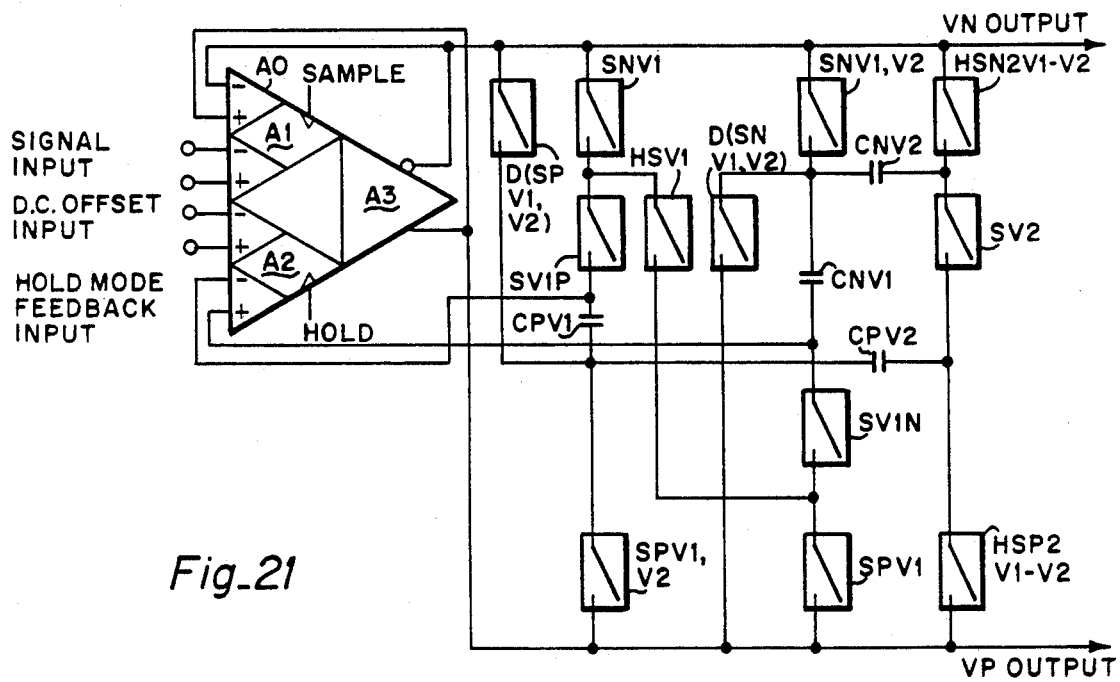
FIG. 21 is a block diagram that shows a fully differential input and output current mode multiplexed S&H amplifier with locally constrained feedback whereby the difference between a doubled first value and a second value are held with feedback and major switch parasitics in the hold mode are reduced by HSV1 closing.

FIG. 21 shows the voltage doubling method of FIG. 20 combined with the voltage offsetting method of

TABLE I

| CONDITIONS/SWITCHES | TRACK V2 | SAMPLE V2 | TRACK V1 | SAMPLE V1 | HOLD 2XV1-V2 |
|---|---|---|---|---|---|
| A1 | on | on | on | on | off |
| A2 | off | off | off | off | on |
| SNV1 | D.C. | D.C. | on | off | off |
| SV1P | D.C. | D.C. | on | off | off |
| HSV1 | D.C. | D.C. | off | off | on |
| SV1N | D.C. | D.C. | on | off | off |
| SPV1 | D.C. | D.C. | on | off | off |
| SNV2 | on | off #2 | off | off | off |
| SV2 | on | off #1 | off | off | off |
| SPV3 | on | off #2 | off | off | off |
| HS-V2 | off | off | on | on | on |

During sampling, SV1P, SNV1, SV1N and SPV1 are closed and HSV1 is open while A0 is active in its sampling mode. To sample SV1P, SNV1, SV1N and SPV1 open after which HSV1 closes and A0 is activated. In this way the nulling feedback action at the differential sampling inputs, in the hold mode, insure that the two representations of the input signal voltage sampled on CPV1 and CNV1 are effectively put in series, thus, exactly doubling the input voltage sampled. Switch HSV1 is used to help eliminate spurious charge injection from SV1P and SV1N. By bringing the terminals of these two switches to zero volts, just as the two terminals of CPV1 and CNV1 are brougt to zero volts through the nulling action of feedback in the hold mode, the charge feedthrough of SV1P and SV1N into FIG. 18 whereby the capacitors that hold a zero offset, namely, CNV1 and CNV2, are in series with the signal sampling capacitors CPV1 and CNV1. Table II shows the various switch conditions for the operation of this circuit.

TABLE II

| CONDITIONS/SWITCHES | Track V2 | Sample V2 | Track V1 | Sample V1 | Hold 2XV1-V2 |
|---|---|---|---|---|---|
| A1 | 1 | 1 | 1 | 1 | 0 |
| A2 | 0 | 0 | 0 | 0 | 1 |
| SPV1, V2 | 1 | | 1 | 0 | 0 |
| SV1P | | | 1 | 0 | 0 |
| SNV1 | | | 1 | 0 | 0 |
| HSV1 | | | | 0 | 2nd 0 | 1 |
| SNV1, V2 | 1 | | 1 | 0 | 0 |

TABLE II-continued

| CONDITIONS/ SWITCHES | Track V2 | Sample V2 | Track V1 | Sample V1 | Hold 2XV1-V2 |
|---|---|---|---|---|---|
| SV1N |  |  | 1 | 0 | 0 |
| SPV1 |  |  | 1 | 0 | 0 |
| SV2 | 1 | 0 | 0 | 0 | 0 |
| HSN2V1-V2 | 0 | 0 | 0 | 0 | 1 |
| HSP2V1-V2 | 0 | 0 | 0 | 0 | 1 |

When using differential signal coupling, as shown, one gains the advantage of being able to use completely symmetrical switching configurations which can be compensated in ways that nonsymmetrical configurations cannot. Specifically, the use of D(SPV1, V2) to compensate SPV1, V2 and D(SNV1, V2) to compensate SNV1, V2 are only possible with symmetry. Unfortunately, there are always shunt capacitances associated with the electrode capacitances of the switch in relation to the substrate that are not as easy to compensate as inter-electrode capacitances. However, because all these capacitances will appear equally on the two capacitor networks connected to the differential inputs of A0 in the hold mode, there divider action appears equal at both inverting and noninverting inputs and, thus, the parasitic dividers only slightly degrade the effective loop gain rather than the nulled DC voltage value held.

Figure 22:
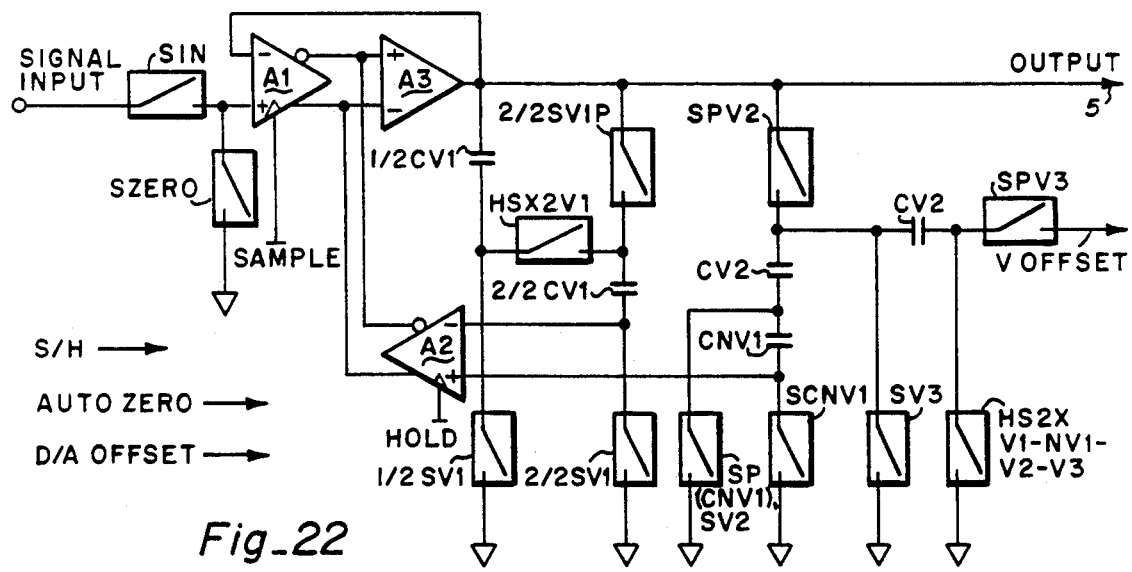
FIG. 22 is a block diagram that shows a CMM S&H with noninverting input signal acquisition mode and the ability to hold the double of an input signal subtracted by two other values, usually a zero offset correction and a 1 bit D-A offset.

FIG. 22 is a single-ended output S&H which implements a voltage doubling in the hold mode with capability for zero offset correction and DA offsetting. The voltage doubling method uses two capacitors which are driven in parallel in the signal acquisition mode by the combined action of A0 in its sampling mode and series switches 1/2SV1, 2/2SV1 and 2/2SV1P, which are closed during signal tracking. Table III shows the switch conditions for the various circuit functions.

ing in a doubling of the voltage sampled on each of them when they were charged in parallel in the signal tracking mode. A slightly different method of accomplishing zero offset correction and DA offsetting or double correlated sampling is used here in contra-distinction to the methods of FIG. 15. Here CNV1 is clamped by switches SCNV1 and SP(CNV1), SV2 being closed during signal acquisition mode or zero offset correction reference cycles. Thus, when SP(CNV1) opens the voltage on CNV1 will be zero volts plus the charge feedthrough of SP(CNV1). Next, sequentially open SCNV1 and then reclose SP(CNV1), SV2 for initial hold mode registration of an uncorrected zero volts input reference correction cycle. Zero offset voltage error is acquired on CV2 by closing SPV2 with SP(CNV1), SV2 is closed and SCNV1 opened. Sampling the zero input offset correction voltage is accomplished when SPV2 opens and registration of an offset corrected output occurs when SP(CNV1), SV2 opens and SV3 closes. In addition, a voltage offset can be either added or subtracted by operation of SPV3 and S2XV1-NV1-V2-V3. Specifically, if SPV3 is closed while SV3 is closed then V offset is charged across CV3. If, then, SV3 is opened and HS2XV1-NV1-V2-V3 is closed then a doubled input signal, minus V offset and error corrected is registered on the S&H output. Alternately, if HS2XV1-V2-V3 is first closed and SV3 closed, then zero volts is charged on CV3. If, next, SV3 and HS2XV1-V2-V3 are opened and then SPV3 closed, then V offset is added to the doubled output signal; or, if the switches associated with 1/2CV1 and 2/2CV1 are operated so as to produce a gain of ½ then V offset will be added to ½ of the originally acquired signal. This case is what is needed to pipeline the reverse of the AD algorithm which yields,

TABLE III

| CONDITIONS/ SWITCHES | Start auto zero | Sample 1st approx. zero | Hold 1st approx. zero error and track offset V2 | Sample offset V2 | Track input on V1 and offset on V3 | Sample Vin as V1 and V offset on CV3 | Hold zero corrected V1 X2 | Hold zero corr. V1 X2-V offset on CV3 |
|---|---|---|---|---|---|---|---|---|
| A1 | 1 | 1 | 0 | 0 | 1 | 1 | 0 | 0 |
| A2 | 0 | 0 | 1 | 1 | 0 | 0 | 1 | 1 |
| Sin | 0 | 0 | 0 | 0 | 1 | 1 | 0 | 0 |
| Szero | 1 | 1 | 1 | 1 | 0 | 0 | 0 | 0 |
| 1/2SV1 | 1 | 0 | 0 | 0 | 1 | 0 | 0 | 0 |
| 2/2SV1 | 1 | 0 | 0 | 0 | 1 | 0 | 0 | 0 |
| 2/2SV1P | 1 | 2nd 0 | 0 | 0 | 1 | 2nd 0 | 0 | 0 |
| HSX2V2 | 0 | 0 | 1 | 1 | 0 | 0 | 1 | 1 |
| SCNV1 | 1 | 0 | 0 | 0 | 0 | 0 | 0 | 0 |
| SP(CNV1) | 1 | 1 | 1 | 1 | 1st 0 | 0 | 0 | 0 |
| SPV2 |  |  | 1 | 0 | 0 | 0 | 0 | 0 |
| SV3 | 0 | 0 | 0 | 0 | 1 | 0 | 1 | 1st 0 |
| SPV3 | 0 | 0 | 0 | 0 | 1 | 0 | 0 | 0 |
| HS2XV1-NV1-V2-V3 | 0 | 0 | 0 | 0 | 0 | 0 | 0 | 2nd 1 |

Signal sampling is accomplished by opening 1/2SV1 and 2/2SV1. It is preferred that 2/2SV1 is used for sampling instead of 2/2SV1P since 2/2SV1 is a ground referenced switch which sees essentially no voltage variation with input signal level, thus, reducing systematic harmonic distortion due to aperture uncertainty associated with input signal level. Of course, there is still a variation in aperture time associated with input signal slew rate. This would require a perfect switch to reduce to zero error.

To transfer control to the hold mode after sampling A2 and A3 are activated and 2/2SV1P is opened after which HSX2V1 is closed. This puts the two capacitors, 1/2CV1 and 2/2CV1, in series in the mode, thus, result-course, a D-A converter function. Also, CV3 is not absolutely needed. A switch connecting the junction of CV2 to either a positive or negative voltage reference will produce an accurate offset as long as the divider ratio of the two switch/capacitor networks are equal from their point of drive to the differential inputs of A2. Depending on how complex the switching sequence use, it might be needed to switch additional capacitance in parallel or series in order to bring a balance to the two divider ratios in different modes of operation (i.e., such as when the S&H is required to both exhibit a gain of ½, 1 or 2, while being offset corrected by CV2 and D-A offset by capacitors or switches driving the junction of CV2 and SPV2. Such complex component sizing problems need to be examined in detail with simulations and prototypes. Optimization is a valuable simulation tool for such device positioning and sizing problems.

To summarize, the unique features of FIG. 22 are the use of simple switch/capacitor configurations involving two capacitors which are charged in parallel and registered in the inverting feedback virtual ground mode to allow for a precision voltage doubling S&H transfer function which can be offset corrected and D-A offset.

FIG. 23 is a slightly more complex switch configuration that is specialized to provide a precision gain of ½ by charging the two equal capacitors 1/2CV1 and 2/2CV1 in parallel in the signal tracking mode and then registering ½ the sampled input signal by using a hold mode registration configuration that puts the two capacitors in parallel. Table IV shows the switch conditions for the various circuit functions.

means that when subtraction of a reference voltage is required, then the negative reference voltage must be available for direct connection.

FIG. 24 shows a switching arrangement that is defined in the state table in the APPENDIX. This embodiment of the invention is capable of gains of 1, ½ and 2 with three different signal input ports for sampling and holding and two capacitor/switch networks capable of offset correcting two different gain modes along with the additional switches needed to properly compensate the dual operation of gains of ½, as needed for D-A converter applications, or gains of 2, as needed for 1-bit AD converter cells. Please note that this particular S&H configuration is capable of performing recirculating A-D or D-A conversion by virtue of the flexiblity of its multiplexing and switches and that it does all this with only one output amplifier, A3 and three current

TABLE IV

| | Set 0 volts on 1/2 and 2/2 V1 | Track zero input | Sample zero input | Hold zero input | Track zero hold error on CV2 | Sample zero hold error on CV2 | Reset zero volts on 1/2 CVI 2/2 CV1 | Track signal on 1/2 CVI 2/2 CV1 | Sample signal on CV1 | Hold 1/2 of signal CV1 with zero off correctic | Hold 1/2 of CV1 with zero offset and add V offset |
|---|---|---|---|---|---|---|---|---|---|---|---|
| A1 | 1 | 1 | 1 | 0 | 0 | 0 | 1 | 1 | 1 | 0 | 0 |
| A2 | 0 | 0 | 0 | 1 | 1 | 1 | 0 | 0 | 0 | 1 | 1 |
| Sin | 0 | 0 | 0 | 0 | 0 | 0 | 0 | 1 | 1 | 0 | 0 |
| Szero | 1 | 1 | 1 | 1 | 1 | 1 | 1 | 0 | 0 | 0 | 0 |
| SSV1 | 1 | 1 | 0 | 0 | 0 | 0 | 1 | 1 | 1 | 0 | 0 |
| 2/2SV1 | 0 | 2nd 1 | 1st 0 | 0 | 0 | 0 | 0 | 2nd 1 | 0 | 0 | 0 |
| HPSV1 | 1 | 1st 0 | 2nd 1 | 1st 1 | 1 | 1 | 1 | 1st 0 | 0 | 1st 1 | 1 |
| HS1/2V1 | 1 | 0 | 3rd 1 | 2nd 1 | 1 | 1 | 1 | 1st 0 | 0 | 2nd 1 | 1 |
| SNV1 | | 1 | 1st 0 | 0 | 0 | 0 | 1 | 1 | 0 | 0 | 0 |
| SPNV1 | | 1 | 1 | 1 | 1 | 1 | 1 | 1 | 1 | 1st 0 | 0 |
| SV2 | | | | | 1 | 0 | 0 | 0 | 0 | 0 | 0 |
| HSV1- NV2- V2- | | | | | 0 | 0 | 0 | 0 | 0 | 2nd 1 | 1st 0 |
| SOF1 | | | | | 0 | 0 | 0 | 0 | 0 | 0 | 2nd 1 |
| Dummy is always open | | | | | | | | | | | |

It should be noted that to start a signal acquisition cycle that will result in an accurate gain of ½ hold mode voltage, it is necessary to start out with equal voltages on both 1/2CV1 and 2/2CV1. This can be done without requiring precision resistors by setting zero volts across each of them before they are switched into a series configuration for signal acquisition. Zero volts can be charged across the capacitors by closing HPSV1, SSV1 and HS1/2V1 with 2/2SV1 open. Alternately, two switches, each in parallel with each of the two capacitors that are to be sampled in a series configuration, could be used to establish an initial zero volts configuration just before commencing signal tracking on the two capacitors in series. Next, HS1/2V1 and HPSV1 open and, then, 2/2SV1 closes with SSV1 still remaining closed to put two capacitors in series. Signal sampling is best controlled by the opening of 2/2SV1 first, then opening SSV1, after which HPSV1 should close, followed by HS1/2V1 closing. It is critical that HPSV1 closes first so that the charge from the dummy switch, which always remains open, will be charged onto 2/2CV1 since this will be equal and opposite to the charge feedthrough of SSV1 and HS1/2V1 onto 1/2CV1. Again, the capacitive divider ratios between the two capacitor/switch networks at the inputs of A2 must be equal in order for zero offset correction and D-A offsetting to be done accurately. Note that FIG. 23 specifically shows a series switch, SOF1, as the D-A offsetting active element rather than a capacitor. This mode multiplexed input amplifiers (A1, A2 and A'2), each of which have their individual capacitor and switching networks associated. Because of the complexity of the operation, state tables for delineation of the basic function switching requirements should be relied on.

The switches D1-3 and D4-6 are provided to compensate charge feedthrough in various of the series/parallels switched capacitor gain modes. Their use is directly analogous to the compensating switches 1/2SV1, 2, 1/2SV1, 3 and 1/2SV1/4 in FIG. 20. Also, OS1 and OS2 are needed to obtain an accurate zero volts condition on 1/2CV1 and 2/2CV1 so that zero offset correction voltages can be obtained for the hold modes involving A2, A3 and A2, A3. This makes it possible to perform offset correction cycles without intervening series switches at the differential inputs of A2 and A'2 which, although they could be used to control a zero input reference condition, would not necessarily include all the parasitics associated with the sampling switches and capacitors operation. The system must be exercised as it is used in order to reflect the actual error that are engendered. The state table only covers the switching operations between A1, A3 and A2, A3. The operation of A2, A3 is identical in principle and practice. CV3 and CV4 and their associated switches are provided to provide DA converter offsetting capabilities for the HOLD mode voltages. Just as in FIG. 23, this can be done by series switches to positive and negative references. The same care must be used in sizing components in this design to obtain the same capacitive divider ratio at the differential inputs of the hold mode amplifiers in order to maintain the accuracy of offset correction and D-A converter offsetting.

FIG. 25 shows a block diagram for a complex S&H capable of recirculating A-D conversion. There is a separate input amplifier dedicated to a gain of one transfer function with offset correction and D-A offsetting. This would be used on the most significant bit conversion of a recirculating A-D converter process. On successive approximations, the signal is alternated between A22 and A23 as further bits are measured and offset out with a renormalization of range with a gain of two transfer functions. Any of the switched capacitor networks previously shown can be used to implement the appropriate transfer functions.

EXAMPLE

The circuit of FIGS. 10 and 11 were fabricated in the form of a silicon wafer based upon the planar, monolithic, epitaxial, PN junction isolation form of circuit using the transistor fabrication process of U.S. Pat. No. 4,940,671, as described above. The following component values were employed:

| COMPONENT | VALUE |
| --- | --- |
| Capacitors 16 and 22 | 10 picofarads |
| Resistor 16a | 25 ohms |
| Resistor 22a | 80 ohms |
| Resistors 33, 34, 48, 49, 76 and 77 | 600 ohms |
| Current Sources 51' and 52' | 100 microamperes |
| Current Sources 53 and 77 | 1.3 milliamperes |
| Current Sources 62 and 63 | 60 microamperes |
| Current Sources 70, 71 and 76 | 1.6 milliamperes |
| Resistor 80 | 5K ohms |
| Capacitor 81 | 3 picofarads |
| Resistor 83 | 1K ohms |
| Resistor 84 | 1.6K ohms |
| Capacitor 85 | 5 picofarads |
| Resistor 95 | 20 ohms |
| Current Sources 99 and 100 | 1 milliamperes |
| Current Source 101 | 2 milliamperes |
| Voltage Sources 104 and 105 | 1.4 volts |

The circuit displayed a hold step of less than 2 millivolts. The acquisition time was less than 180 nanoseconds to 0.01% accuracy. The input leakage into transistor 44a was much less than a nanoampere. The settling time was 180 nanoseconds to 0.01%. The slew rate at terminal 11 was 140 volts per microsecond for an input step of 10 volts at terminal 1.

The above-described component configurations represent applicant's preferred embodiment of the invention. A person skilled in the art will recognize alternatives and equivalents within the spirit and intent of the invention, that could be employed. For example, other low input current diff-amp configurations could be employed in place of diff-amps A1 and A2. Also, with regard to FIG. 10, other clamp circuits for A1 could be employed. Accordingly, it is intended that the scope of the invention be limited only by the claims that follow.

APPENDIX TABLE FOR FIG. 14

| | Track Zero Input | S/H Zero Input | Sample & Subtract Zero offset Correction | Track Signal | S & H With Offset Correction Subtracted |
| --- | --- | --- | --- | --- | --- |
| S/H Clock | 1 | 0 | 0 | 1 | 0 |
| A1 | 1 | 0,2nd | 0 | 1 | 0,2nd |
| SV1 | 1 | 0,1st | 0 | 1 | 0,1st |
| A2 | 0 | 1,2nd | 1 | 0 | 1,2nd |
| Auto Zero Input | 0 | 0 | 1 | 1 | 1 |
| S7 | 1 | 1 | 0 | 0 | 0 |
| SPV2 | 1 | 1 | 0,1st | 0 | 0 |
| SV2 | 1 | 1 | 0,1st | 0 | 0 |
| S6 | 0 | 0 | 1,1st | 1 | 1 |
| HS-V2 | 0 | 0 | 1,2nd | 1 | 1 |

TABLE FOR FIG. 15

| | TRACK ZERO INPUT | S & H ZERO INPUT | TRACK ZERO OFFSET | SAMPLE ZERO OFFSET | TRACK INPUT | SAMPLE FIRST VOLTAGE | SAMPLE SECOND VOLTAGE | HOLD 1ST-2ND SAMPLE |
| --- | --- | --- | --- | --- | --- | --- | --- | --- |
| S/H Clock | 1 | 0 | 0 | 0 | 1 | 1 | 1 | 0 |
| A1 | 1 | 0 | 0 | 0 | 1 | 1 | 1 | 0 |
| SV1 | 1 | 0,1st | 0 | 0 | 1 | 0 | 0 | 0 |
| A2 | 0 | 1,2nd | 1 | 1 | 0 | 0 | 0 | 1 |
| S6 | 0 | 0 | 0 | 0 | 1 | 1 | 1 | 1 |
| S8 | 0 | 0 | 0 | 0 | 1 | 1 | 1 | 1 |
| S7 | 1 | 1 | 1 | 1 | 0 | 0 | 0 | 0 |
| SV2 | 0 | 1,2nd | 1 | 1 | 0 | 0 | 0 | 0 |
| SPV2 | 0 | 0 | 1 | 0 | 0 | 0 | 0 | 0 |
| SV3 | 1 | 0,1st | 0 | 0 | 1 | 1 | 0,1st | 0 |
| SPV3 | 1 | 0,1st | 0 | 0 | 1 | 1 | 0 | 0 |
| HS-V2-V3 | 0 | 0 | 0 | 0 | 0 | 0 | 0 | 1 |

TABLE FOR FIG. 16

| | TRACK ZERO VOLTS | S & H ZERO VOLTS & TRACK OFFSET | SAMPLE OFFSET | TRACK INPUT SIGNAL | SAMPLE V1 | SAMPLE V2 | HOLD V1-V2-V3 |
| --- | --- | --- | --- | --- | --- | --- | --- |
| S6 | 0 | 0 | 0 | 1 | 1 | 1 | 1 |
| S7 | 1 | 1 | 1 | 0 | 0 | 0 | 0 |
| A1 | 1 | 0 | 0 | 1 | 1 | 1 | 0 |
| A2 | 0 | 1 | 1 | 0 | 0 | 0 | 1 |
| SV1 | 1 | 0,1st | 0 | 1 | 0 | 0 | 0 |

TABLE FOR FIG. 16-continued

|  | TRACK ZERO VOLTS | S & H ZERO VOLTS & TRACK OFFSET | SAMPLE OFFSET | TRACK INPUT SIGNAL | SAMPLE V1 | SAMPLE V2 | HOLD V1-V2-V3 |
|---|---|---|---|---|---|---|---|
| SNV1.V2 | 1 | 0 | 0 | 1 | 1 | 1 | 0 |
| SPV1.V2 | 1 | 0 | 0 | 1 | 1 | 1 | 0 |
| SV2 | 1 | 0,1st | 0 | 1 | 1 | 0 | 0 |
| SNV3 | 0 | 1 | 0 | 0 | 0 | 0 | 0 |
| SV3 | 0 | 1 | 0,1st | 0 | 0 | 0 | 0 |
| SPV2 | 0 | 1 | 0 | 0 | 0 | 0 | 0 |
| HV1-V2-V3 | 0 | 0 | 0 | 0 | 0 | 0 | 1 |
| HSNV1-V2-V3 | 0 | 0 | 0 | 0 | 0 | 0 | 1,2nd |
| HSPV1-V2-V3 | 0 | 0 | 0 | 0 | 0 | 0 | 1,2nd |

TABLE FOR FIG. 18

|  | TRACK ZERO VOLTS | S & H ZERO VOLTS & TRACK OFFSET | SAMPLE OFFSET | TRACK INPUT SIGNAL | SAMPLE V1 | SAMPLE V2 | HOLD V1-V2 OFFSET CORRECTED |
|---|---|---|---|---|---|---|---|
| SVIN1 | 0 | 0 | 0 | 1 | 1 | 1 | 1 |
| SVIN2 | 0 | 0 | 0 | 1 | 1 | 1 | 1 |
| HSVIN | 1 | 1,3rd | 1 | 0 | 0 | 0 | 0 |
| A1 | 1 | 0 | 0 | 1 | 1 | 1 | 0 |
| A2 | 0 | 1,3rd | 1 | 0 | 0 | 0 | 1 |
| SV1 | 1 | 0,1st | 0 | 1 | 0 | 0 | 0 |
| SNV1 | 1 | 0,2nd | 0 | 1 | 1 | 1 | 0,1st |
| SPV1 | 1 | 0,2nd | 0 | 1 | 1 | 1 | 0,1st |
| SV2 | 1 | 0,1st | 0 | 1 | 1 | 0 | 0 |
| HSN-V2 | 0 | 1,3rd | 1 | 0 | 0 | 0 | 1 |
| HSPV2 | 0 | 1,3rd | 1 | 0 | 0 | 0 | 1 |
| SNV3 | 1 | 1 | 0,2nd | 0 | 0 | 0 | 0 |
| SV3 | 1 | 1 | 0,1st | 0 | 0 | 0 | 0 |
| SPV3 | 1 | 1 | 0,2nd | 0 | 0 | 0 | 0 |
| HS-V3 | 0 | 0 | 1,3rd | 1 | 1 | 1 | 1 |

TABLE FOR FIG. 24

| Sampling offset corrections for A1A3, gain = 1 and A2A3, gain = 2 | | | | | | |
|---|---|---|---|---|---|---|
|  | TRACK ZERO INPUT FOR A1A3 GAIN = 1 | S & H ZERO INPUT & TRACK OFFSET | SAMPLE ZERO INPUT OFFSET ON CV2 | ZERO BOTH CV1 CAP'S | S & H WITH GAIN = 2 & TRACK OFFSET ON 2CV2 | SAMPLE A2A3 OFFSET WITH GAIN = 2 |
| SIN | 0 | 0 | 0 | 0 | 0 | 0 |
| SZERO | 1 | 1 | 1 | 1 | 1 | 1 |
| A1 | 1 | 0 | 0 | 1 | 0,3rd | 0 |
| A2 | 0 | 1,2nd | 1 | 0 | 1,3rd | 1 |
| PS1/2CV1 | 1 | 1 | 1 | 0 | 1,2nd | 1 |
| PS2/2CV1 | 1 | 1 | 1 | 0 | 0 | 0 |
| OS1 | 0 | 0 | 0 | 1 | 0,2nd | 0 |
| OS2 | 0 | 0 | 0 | 1 | 0,2nd | 0 |
| D1 | 0 | 0 | 0 | 0 | 0 | 0 |
| D2 | 0 | 0 | 0 | 0 | 0 | 0 |
| D3 | 0 | 0 | 0 | 0 | 0 | 0 |
| D4 | 0 | 0 | 0 | 0 | 0 | 0 |
| D5 | 0 | 0 | 0 | 0 | 0 | 0 |
| D6 | 0 | 0 | 0 | 0 | 0 | 0 |
| SSV1 | 0 | 0 | 0 | 0 | 1,3rd | 1 |
| HS1/2V1 | 1 | 1 | 1 | 1 | 0,1st | 0 |
| 2/2SV1 | 1 | 0,1st | 0 | 1 | 0,1st | 0 |
| SNV1 | 1 | 0,1st | 0 | 1 | 0,1st | 0 |
| SPNV1 | 1 | 1 | 1 | 1 | 1 | 1 |
| SP2CV2 | 0 | 0 | 0 | 0 | 1 | 0 |
| SCV30 | 0 | 0 | 0 | 0 | 0 | 0 |
| SV2 | 0 | 1 | 0 | 0 | 0 | 0 |
| SCV40 | 0 | 0 | 0 | 0 | 0 | 0 |
| SOF1 | 0 | 0 | 0 | 0 | 0 | 0 |
| HSV1-NV1-V2 | 0 | 0 | 0 | 0 | 0 | 0 |
| SPV3 | 0 | 0 | 0 | 0 | 0 | 0 |
| HSV1PNV1-V2-V3 | 0 | 0 | 0 | 0 | 0 | 0 |

|  | SET ZERO VOLTS ON CV1 CAPS | S & H ZERO INPUT GAIN = 1/2 TRACK OFFSET ON 2SC2 | HOLD ZERO VOLTS GAIN = 1/2 OFFSET CORRECTED BY 2SC2 | ADD V REF TO OFFSET CORRECTED ZERO VOLTS FOR TOTAL OUTPUT OF VOUTPUT = VREF |
|---|---|---|---|---|
| SIN | 0 | 0 | 0 | 0 |
| SZERO | 1 | 1 | 1 | 1 |

TABLE FOR FIG. 24-continued

| Sampling offset corrections for A1A3, gain = 1 and A2A3, gain = 2 | | | | |
|---|---|---|---|---|
| A1 | 1 | 0 | 0 | 0 |
| A2 | 0 | 1 | 1 | 1 |
| PS1/2CV1 | 0 | 1,3RD | 1 | 1 |
| PS2/2CV1 | 0 | 1,3RD | 1 | 1 |
| OS1 | 1 | 0,1ST | 0 | 0 |
| OS2 | 0 | 0 | 0 | 0 |
| D1 | 1 | 1 | 0 | 0 |
| D2 | 0 | 0 | 0 | 0 |
| D3 | 0 | 1 | 1 | 1 |
| D4 | 0 | 0 | 0 | 0 |
| D5 | 1 | 0 | 0 | 0 |
| D6 | 1 | 0 | 0 | 0 |
| SSV1 | 1 | 0,2ND | 0 | 0 |
| HS1/2V1 | 0 | 1,4TH | 1 | 1 |
| 2/2SV1 | 1 | 0,1st | 0 | 0 |
| SNV1 | 1 | 0,1st | 0 | 0 |
| SPNV1 | 1 | 1 | 0,1ST | 0 |
| SP2CV2 | 0 | 1 | 0,1ST | 0 |
| SCV30 | 0 | 0 | 1,2ND | 1 |
| SV2 | 0 | 0 | 0 | 0 |
| SCV40 | 0 | 0 | 0 | 0 |
| SOF1 | 0 | 0 | 0 | 0 |
| HSV1-NV1-V2 | 0 | 0 | 0 | 0 |
| SPV3 | 0 | 0 | 0 | 1,2ND |
| HSV1 PNV1-V2-V3 | 0 | 0 | 1 | 0,1ST |

I claim:

1. A sample and hold circuit having a signal input, an output and a control logic input, said control logic input being responsive to logic signals that command said circuit to operate in a sample mode in which said output replicates said signal input or in a hold mode in which said output holds the signal input value present at the instant of the hold logic command, said circuit comprising:
   an output stage having an output suitable for providing said circuit output and an input;
   first and second differential input stages each having outputs commonly connected to drive said input of said output stage and each having inverting and noninverting differential inputs, said first and second differential input stages having substantially equal operating characteristics including substantial signal gain;
   means for coupling said noninverting input of said first differential input stage to said signal input whereby said circuit responds to said input;
   means, responsive to said logic signals, for alternately turning said first and second differential input stages on whereby when said sample mode is commanded said first differential input stage is on and when said hold mode is commanded said second differential input stage is on;
   hold capacitor means coupled between said output of said output stage and the inverting input of said second differential input stage to produce negative feedback in said hold mode; and
   first switch means coupled between said inverting input of said second differential input stage and a source of reference potential and means for turning said first switch means on when said sample mode is commanded whereby the charge on said hold capacitor means follows said output signal in said sample mode.

2. The sample and hold circuit of claim 1 wherein said first switch means is connected to a source of reference potential whereby said hold capacitor means is returned to a virtual ground in said sample mode and said virtual ground is maintained in said hold mode by virtue of said negative feedback.

3. The sample and hold circuit of claim 1 further including means for coupling said output of said output stage to the inverting input of said first differential input stage and for coupling the noninverting input of said first differential input stage to the input terminal of said circuit whereby said circuit operates as a unity gain voltage follower in said sample mode.

4. The sample and hole circuit of claim 1 further including means for coupling a first resistor between said output of said output stage and the inverting input of said first differential input stage and means for coupling a second resistor between the inverting input of said first differential input stage and said circuit input terminal whereby said circuit operates as an inverter in said sample mode.

5. The sample and hold circuit of claim 4 wherein said first and second resistors have equal value whereby said circuit has unity voltage gain in said sample mode.

6. The circuit of claim 1 wherein said first and second differential input stages have differential outputs and said output stage has a differential input coupled in common to said outputs of said first and second differential input stages.

7. The sample and hold circuit of claim 6 wherein said first and second differential input stages have high differential input impedances as well as differential outputs.

8. The sample and hold circuit of claim 1 further including a dummy hold capacitor coupled to said noninverting input of said second differential input stage and said source of reference potential and second switch means coupled to said dummy capacitor.

9. The sample and hold circuit of claim 1 wherein said first and second differential input stages each include differentially connected transistor pairs with their tail currents alternately switched by said switching means to a common constant current supply whereby said first and second differential input stages pass identical currents when on.

10. The sample and hold circuit of claim 8 further including third and fourth switch means coupled between said first differential input stage outputs and said output stage inputs and means for turning said third and fourth switch means off in response to said hold command whereby said first differential input stage outputs are isolated when said hold mode is commanded.

11. The sample and hold circuit of claim 10 further including means responsive to said hold mode command for clamping said first differential input stage to render it inoperative as well as isolated during said hold mode.

12. The circuit of claim 1 further including an auto zero circuit responsive to an auto zero command and comprising:
switch means for returning the input of said first differential input stage to a source of reference potential in response to said auto zero command;
auto zero capacitor means;
switch means for coupling said auto zero capacitor means to said output of said output stage in response to said auto zero command; and
switch means for coupling said auto zero capacitor means to said input of said second differential input stage in the absence of said auto zero command whereby the charge on said auto zero capacitor means biases said second differential input stage in the hold mode thereby to cancel the circuit offset.

13. The circuit of claim 12 wherein said switch means for coupling connect said auto zero capacitor means to said output of said output stage in response to said auto zero command whereby a charge proportional to circuit offset is developed and said switch means for coupling further connect said auto zero capacitor means to said noninverting input of said second differential input stage in a polarity that will cancel the circuit offset in response to an absence of said auto zero command.

14. The circuit of claim 12 wherein said auto zero command operates at a submultiple of said logic signals.

15. The circuit of claim 12 further including a sample correlating circuit responsive to a correlation command, said correlating circuit comprising:
correlation capacitor means;
switch means for coupling said correlation capacitor in series with said auto zero capacitor means which is charged to the circuit offset potential;
means for charging said correlation capacitor means to the output of said sample and hold circuit in the hold mode in response to the correlation command whereby said correlation capacitor means receives a charge equal to the circuit hold voltage which makes the charge a replica of the hold capacitor means charge; and
means for coupling said correlation capacitor means in series with said auto zero capacitor means to said noninverting input of said second differential input stage in the absence of said correlation and auto zero commands whereby said correlation capacitor charge subtracts from said hold capacitor means charge to determine the output of said output stage.

16. The circuit of claim 15 further including an offset circuit responsive to an offset command, said offset circuit comprising:
offset capacitor means;
switch means for coupling said offset capacitor means in series with said correlation capacitor means;
means responsive to said offset command for charging said offset capacitor means to a reference voltage level wherein said reference voltage is selected to produce the desired charge; and
means for coupling said offset capacitor means to said correlation capacitor means and said offset capacitor whereby said correlation and offset functions are offset by an amount determined by the charge on said offset capacitor means.

17. The circuit of claim 16 wherein the offset is controlled to be equal to the value of one digital bit.

18. A sample and hold circuit capable of responding to an analog input signal to produce a related output in response to a sample mode command and to provide a constant output in response to a hold mode command wherein said constant output is a reproduction of said analog input signal at the instant of said hold command, said circuit comprising:
first and second differential amplifier means having differential inputs and outputs;
means for coupling at least one of the differential inputs of said first differential amplifier means to said analog input signal;
control means responsive to said hold mode command for selectively operating said first and second differential amplifier means in a complementary fashion whereby said first differential amplifier means is off in said hold mode and said second differential amplifier means is off in said sample mode;
an operational amplifier having a differential input and a single ended output that comprises said related output;
means for commonly coupling the outputs of said first and second differential amplifier means to said differential input of said operational amplifier;
a hold capacitor coupled between said output of said operational amplifier and one input of said second differential amplifier means differential inputs to create a negative feedback in response to said hold mode command;
a dummy hold capacitor coupled between the other input of said second differential amplifier means and a source of reference potential; and
first switch means coupled between said inputs of said second differential amplifier means and said source of reference potential and operated by said control means so that said first switch means are off when said second differential amplifier means is on whereby said second differential amplifier means inputs operate at a virtual ground in said hold mode.

19. The circuit of claim 18 wherein said first and second differential amplifier means share a common load and are connected to drive the differential input of said operational amplifier.

20. The circuit of claim 19 further including second switch means coupled between said outputs of said first differential amplifier means and said common load and operated by said control means to be on when said first differential amplifier means is on and off when said second differential amplifier means is on thereby to disconnect said first differential amplifier means in the hold mode.

21. The circuit of claim 20 further including clamping means operated by said control means and functioning to disable said first differential amplifier means when said second differential amplifier means is on in the hold mode.

22. The circuit of claim 18 wherein said operational amplifier includes differential output terminals and said hold capacitor means comprise a matched pair of hold capacitors coupled between said operational amplifier differential outputs and said differential inputs of said second differential amplifier means input.

* * * * *